US006577252B2

(12) United States Patent
Hotta

(10) Patent No.: US 6,577,252 B2
(45) Date of Patent: Jun. 10, 2003

(54) AUDIO SIGNAL ENCODING APPARATUS

(75) Inventor: Atsushi Hotta, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/040,635

(22) Filed: Jan. 9, 2002

(65) Prior Publication Data

US 2002/0120442 A1 Aug. 29, 2002

(30) Foreign Application Priority Data

Feb. 27, 2001 (JP) ....................................... 2001-052113

(51) Int. Cl.[7] ................................................ H03M 7/00
(52) U.S. Cl. ........................................... 341/50; 341/65
(58) Field of Search ............................... 341/50, 65, 67

(56) References Cited

U.S. PATENT DOCUMENTS 5,619,197 A * 4/1997 Nakamura ................... 341/50
6,266,644 B1 * 7/2001 Levine ....................... 704/503

* cited by examiner

*Primary Examiner*—Peguy JeanPierre
*Assistant Examiner*—Joseph J Lauture
(74) *Attorney, Agent, or Firm*—Birch, Stewart, Kolasch & Birch, LLP

(57) ABSTRACT

An audio signal encoding apparatus is provided which is capable of preventing deterioration in the objective characteristics of a signal to be encoded without using parameters from a psychoacoustic model generated based on human auditory characteristics or by replacing such parameters with those by which the signal can be effectively quantized in cases where the width of a frequency band in which frequency component such as a sine wave of the signal concerned exists is narrow. The audio signal encoding apparatus includes a psychoacoustic model section 1, an MDCT processing section 2 and an iterative loop processing section 3. The psychoacoustic model section 1 includes an FFT operation section 11, a block type determination section 12 and an SMR operation section 13. The iterative loop processing section 3 includes an allowable error amount calculation section 31, a bit amount/error amount control section 32, a normalization processing section 33, a quantization section 34 and a Huffman encoding section 35. The apparatus further includes a multiplexer section 4 for multiplexing a processing block type from the block type determination section 12, a scale factor from the bit amount/error amount control section 32, a Huffman code book number and a Huffman code from the Huffman encoding section 35, a sine wave discrimination section 14*a* for discriminating whether or not the input signal is a sine wave, by using the FFT frequency spectrum calculated by the FFT operation section 11, and a switching element 15, 16 for switching between use and nonuse of an output value of the SMR operation section 13 based on the result of sine wave discrimination in the sine wave discrimination section 14*a*.

18 Claims, 15 Drawing Sheets

AUDIO SIGNAL ENCODING APPARATUS

This application is based on Application No. 2001-052113, filed in Japan on Feb. 27, 2001, the contents of which are hereby incorporated by reference.

BACKGROUND OF THE INVENTION

1. Field of the Invention

The present invention relates to an audio signal encoding apparatus for encoding a wide-band audio signal and multiplexing and transmitting an encoded bit string generated by the encoding processing to a transmission line. More specifically, the present invention relates to a technique of preventing deterioration in objective characteristics such as an S/N ratio (signal-to-noise ratio), etc., in cases where the component in the form of a frequency component such as a sine wave of a signal to be processed exists in a narrow band.

2. Description of the Related Art

As a typical example of conventional audio signal encoding apparatuses, reference is made to one illustrated in the ISO/IEC 13818-7 standard (hereinafter, referred to as an MPEG-2 AAC method). Here, note that the MPEG-2 AAC method is defined in detail in that standard.

FIG. 15 illustrates a block diagram of the MPEG-2 AAC method as such a conventional audio signal encoding apparatus. In this figure, the conventional audio signal encoding apparatus includes a psychoacoustic model section 1, an MDCT (Modified Discrete Cosine Transform) processing section 2, an iterative loop processing section 3, and a multiplexer section 4. The psychoacoustic model section 1 includes an FFT (Fast Fourier Transform) operation section 11, a block type determination section 12 and an SMR (Signal Mask Ratio) operation section 13. The iterative loop processing section 3 includes an allowable error amount calculation section 31, a bit amount/error amount control section 32, a normalization processing section 33, a quantization section 34, and a Huffman encoding section 35.

Next, the operation of this audio signal encoding apparatus will be described below.

An input signal input to the psychoacoustic model section 1 is subjected to FFT operation processing in the FFT operation section 11 to generate an FFT frequency spectrum.

Now, the processing block type will be briefly described prior to an explanation of the block type determination section 12. When a signal on a time base is converted into a signal on a frequency base, there are two kinds of processing block types, one being a long type in which a signal to be analyzed is expanded in time for improved frequency resolution, the other being a short type in which a signal to be analyzed is shortened in time for improved time resolution. The former type is used in the case where there exists only a stationary signal, whereas the latter is used when there is a rapid signal change. In the MPEG-2 AAC method, by properly using these two kinds of processing block types according to the characteristics of a signal to be analyzed, it is possible to prevent the generation of unpleasant noise called a pre-echo, which would otherwise result from an insufficient time resolution.

The block type determination section 12 calculates a masking threshold from an FFT frequency spectrum from the FFT operation section 11, determines the block type of the input signal based on the masking threshold thus obtained, and passes the result of determination to the MDCT processing section 2 and the multiplexer section 4 as a processing block type.

Then, the SMR operation section 13 calculates an SMR based on the FFT frequency spectrum from the FFT operation section 11 and the masking threshold in the block type determination section 12, and sends the SMR thus generated to the allowable error amount calculation section 31 in the iterative loop processing section 3.

The MDCT processing section 2 performs conversion processing, i.e., frequency orthogonal transformation processing, from the time base to the frequency base based on the processing block type received from the block type determination section 12. As a result, the MDCT frequency spectrum thus generated is passed to the allowable error amount calculation section 31 and the normalization processing section 33 in the iterative loop processing section 3.

The allowable error amount calculation section 31 in the iterative loop processing section 3 performs multiplication between the MDCT frequency spectrum and the reciprocal (1/SMR) of the SMR to provide an allowable amount of error. The amount of error as mentioned here represents an indication of a difference between the MDCT frequency spectrum from the MDCT processing section 2 and the dequantized value generated through quantization/dequantization, that is, a quantizing error. If this quantizing error is within an allowable range, noise can not be perceived by the human ear.

The amount of error calculated in the allowable error amount calculation section 31 is passed to the bit amount/error amount control section 32 where this amount of error is used as an index of determination as to whether the MDCT frequency spectrum generated through quantization/dequantization satisfies the allowable amount of error.

The normalization processing section 33 normalizes the MDCT frequency spectrum passed from the MDCT processing section 2 by using a scale factor selected in the bit amount/error amount control section 32.

The quantization section 34 quantizes the MDCT frequency spectrum normalized by the normalization processing section 33, and passes the result of quantization to the Huffman encoding section 35. In addition, the quantization section 34 performs dequantization so as to calculate an amount of error in the quantization, and the value thus obtained by the dequantization is passed to the bit amount/error amount control section 32.

The quantized MDCT frequency spectrum is subjected to Huffman encoding in the Huffman encoding section 35, so that an amount of bits actually needed are supplied to the bit amount/error amount control section 32, and a Huffman code book number and a Huffman code are passed to the multiplexer section 4.

The bit amount/error amount control section 32 calculates a difference between the MDCT frequency spectrum from the MDCT processing section and the dequantized MDCT frequency spectrum obtained from the quantization section 34, that is, an amount of error due to quantization, which is then compared with the amount of error calculated by the allowable error amount calculation section 31. As a result, when it is determined that the amount of error due to the quantization is greater than the amount of error calculated by the allowable error amount calculation section 31, the value of the scale factor is reduced and then passed to the normalization processing section 33.

On the other hand, when it is determined that the amount of error due to the quantization is smaller than the amount of error calculated by the allowable error amount calculation section 31, a comparison is made between an amount of used bits obtained from the Huffman encoding section 35 and an allowable amount of bits calculated from the bit rate specified upon encoding. As a result, when it is determined that the amount of the used bits is greater than the allowable amount of bits, the value of the scale factor is increased and then passed to the normalization processing section 33. On the other hand, when it is determined that the amount of used bits is smaller than the allowable amount of bits, the processing in the iterative loop processing section 3 is ended, and the process is shifted to multiplex processing.

As described above, the processing in the iterative loop processing section 3, which is constituted by the allowable error amount calculation section 31, the bit amount/error amount control section 32, the normalization processing section 33, the quantization section 34 and the Huffman encoding section 35, is reiterated until when the quantized MDCT frequency spectrum actually becomes lower than the allowable amount of error, and when the amount of bits required for quantization actually becomes lower than the allowable amount of bits.

Thereafter, the quantized and Huffman-encoded MDCT frequency spectrum, together with ancillary information such as a header, the processing block type determined by the block type determination section 12, the scale factor selected by the bit amount/error amount control section 32 and the Huffman code book number selected by the Huffman encoding section 35, is subjected to the multiplex processing in the multiplexer section 4, so that it is transformed into a coded stream and then sent out to a transmission line.

In general, an encoding system using a psychoacoustic model is featured in that the auditory quality of a voice/music signal is good. However, there is a tendency that the objective characteristics such as, for example, S/N ratio (Signal/Noise: signal-to-noise ratio), etc., are deteriorated. In the above-mentioned conventional audio signal encoding apparatus, etc., even when the width of a frequency band in which the frequency component such as a sine wave of a signal to be encoded exists is narrow, the signal has been subjected to the encoding processing by using parameters in consideration of the human auditory characteristics calculated in a psychoacoustic model, thus giving rise to a problem in that the objective characteristics of the signal are deteriorated.

SUMMARY OF THE INVENTION

The present invention is intended to obviate the problem as referred to above, and has for its object to provide an audio signal encoding apparatus which is capable of preventing deterioration in the objective characteristics of a signal to be encoded without using parameters from a psychoacoustic model generated based on the human auditory characteristics or by replacing such parameters with those by which the signal can be effectively quantized in cases where the width of a frequency band in which the frequency component such as a sine wave of the signal concerned exists is narrow.

Bearing the above object in mind, according to a first aspect of the present invention, there is provided an audio signal encoding apparatus comprising: an FFT operation section for performing FFT operation processing of an input signal; a block type determination section for determining a processing block type of an MDCT processing section by using an FFT frequency spectrum calculated by the FFT operation section; a sine wave discrimination section for discriminating whether or not the input signal is a sine wave, by using the FFT frequency spectrum calculated by the FFT operation section; an SMR operation section for calculating an SMR by using the FFT frequency spectrum calculated by the FFT operation section; a switching section for switching between use and nonuse of an output value from the SMR operation section based on the result of sine wave discrimination in the sine wave discrimination section; an MDCT processing section for calculating an MDCT frequency spectrum by performing frequency orthogonal transformation processing of the input signal based on the processing block type received from the block type determination section; an allowable error amount calculation section for calculating an allowable amount of error by using the SMR and the MDCT frequency spectrum; a bit amount/error amount control section for determining a scale factor by performing bit amount/error amount control based on an amount of error from the allowable error amount calculation section, a dequantized value from a quantization section and an amount of used bits from a Huffman encoding section; a normalization processing section for normalizing the MDCT frequency spectrum from the MDCT processing section based on the scale factor from the bit amount/error amount control section; the quantization section for quantizing and dequantizing the MDCT frequency spectrum normalized by the normalization processing section; the Huffman encoding section for performing Huffman encoding of the quantized MDCT frequency spectrum to output a Huffman code book number and a Huffman code and to calculate an amount of used bits; and a multiplexer section for multiplexing the processing block type from the block type determination section, the scale factor from the bit amount/error amount control section, the Huffman code book number and the Huffman code from the Huffman encoding section.

In a preferred form of the first aspect of the present invention, the audio signal encoding apparatus further comprises a switching section for switching between execution and stop of the calculation processing of the SMR operation section based on the result of sine wave discrimination in the sine wave discrimination section.

In another preferred form of the first aspect of the present invention, the switching section for switching between use and nonuse of an output value from the SMR operation section based on the result of sine wave discrimination in the sine wave discrimination section uses a preset SMR value when the output value from the SMR operation section is not used.

According to a second aspect of the present invention, there is provided an audio signal encoding apparatus comprising: an FFT operation section for performing FFT operation processing of an input signal; a block type determination section for determining a processing block type of an MDCT processing section by using an FFT frequency spectrum calculated by the FFT operation section; a sine wave discrimination section for discriminating whether or not the input signal is a sine wave, by using the FFT frequency spectrum calculated by the FFT operation section; an SMR operation section for calculating an SMR by using the FFT frequency spectrum calculated by the FFT operation section; an MDCT processing section for calculating an MDCT frequency spectrum by performing frequency orthogonal transformation processing of the input signal based on the processing block type received from the block type determination section; an allowable error amount calculation section for calculating an allowable amount of error by using the SMR and the MDCT frequency spectrum; a switching section for switching between use and nonuse of an output value from the allowable error amount calculation section based on the result of sine wave discrimination in the sine wave discrimination section; a bit amount/error amount control section for determining a scale factor by performing bit amount/error amount control based on an amount of error from the allowable error amount calculation section, a dequantized value from a quantization section and an amount of used bits from a Huffman encoding section; a normalization processing section for normalizing the MDCT frequency spectrum from the MDCT processing section based on the scale factor from the bit amount/error amount control section; the quantization section for quantizing and dequantizing the MDCT frequency spectrum normalized by the normalization processing section; the Huffman encoding section for performing Huffman encoding of the quantized MDCT frequency spectrum to output a Huffman code book number and a Huffman code and to calculate an amount of used bits; and a multiplexer section for multiplexing the processing block type from the block type determination section, the scale factor from the bit amount/error amount control section, the Huffman code book number and the Huffman code from the Huffman encoding section.

In a preferred form of the second aspect of the present invention, the audio signal encoding apparatus further comprises: a switching section for switching between execution and stop of the calculation processing of the SMR operation section based on the result of sine wave discrimination in the sine wave discrimination section; and a switching section for switching between execution and stop of the calculation processing of the allowable error amount calculation section based on the result of sine wave discrimination in the sine wave discrimination section.

In another preferred form of the second aspect of the present invention, when the output value from the allowable error amount calculation section is not used, a preset allowable error amount value is used in the switching section for switching between use and nonuse of an output value from the allowable error amount calculation section based on the result of sine wave discrimination in the sine wave discrimination section.

In a further preferred form of the second aspect of the present invention, when the calculation processing of the SMR operation section is stopped, a preset SMR value is used in the switching section for switching between execution and stop of the calculation processing of the SMR operation section based on the result of sine wave discrimination in the sine wave discrimination section.

In a still further preferred form of the first or second aspect of the present invention, the FFT frequency spectrum is an amplitude spectrum.

In a yet further preferred form of the firs or second aspect of the present invention, the FFT frequency spectrum is a power spectrum.

In a further preferred form of the first or second aspect of the present invention, the FFT frequency spectrum is a real number component or an imaginary number component of the FFT operation result.

According to a third aspect of the present invention, there is provided an audio signal encoding apparatus comprising: an FFT operation section for performing FFT operation processing of an input signal; a block type determination section for determining a processing block type of an MDCT processing section by using an FFT frequency spectrum calculated by the FFT operation section; an MDCT processing section for calculating an MDCT frequency spectrum by performing frequency orthogonal transformation processing of the input signal based on the processing block type received from the block type determination section; a sine wave discrimination section for discriminating whether or not the input signal is a sine wave, by using the MDCT frequency spectrum calculated by the MDCT processing section; an SMR operation section for calculating an SMR by using the FFT frequency spectrum calculated by the FFT operation section; a switching section for switching between use and nonuse of an output value from the SMR operation section based on the result of sine wave discrimination in the sine wave discrimination section; an allowable error amount calculation section for calculating an allowable amount of error by using the SMR and the MDCT frequency spectrum; a bit amount/error amount control section for determining a scale factor by performing bit amount/error amount control based on an amount of error from the allowable error amount calculation section, a dequantized value from a quantization section and an amount of used bits from a Huffman encoding section; a normalization processing section for normalizing the MDCT frequency spectrum from the MDCT processing section based on the scale factor from the bit amount/error amount control section; the quantization section for quantizing and dequantizing the MDCT frequency spectrum normalized by the normalization processing section; the Huffman encoding section for performing Huffman encoding of the quantized MDCT frequency spectrum to output a Huffman code book number and a Huffman code and to calculate an amount of used bits; and a multiplexer section for multiplexing the processing block type from the block type determination section, the scale factor from the bit amount/error amount control section, the Huffman code book number and the Huffman code from the Huffman encoding section.

In a preferred form of the third aspect of the present invention, the audio signal encoding apparatus further comprises a switching section for switching between execution and stop of the calculation processing of the SMR operation section based on the result of sine wave discrimination in the sine wave discrimination section.

In another preferred form of the third aspect of the present invention, when the output value from the SMR operation section is not used, a preset SMR value is used in the switching section for switching between use and nonuse of an output value from the SMR operation section based on the result of sine wave discrimination in the sine wave discrimination section.

According to a fourth aspect of the present invention, there is provided an audio signal encoding apparatus comprising: an FFT operation section for performing FFT operation processing of an input signal; a block type determination section for determining a processing block type of an MDCT processing section by using an FFT frequency spectrum calculated by the FFT operation section; an MDCT processing section for calculating an MDCT frequency spectrum by performing frequency orthogonal transformation processing of the input signal based on the processing block type received from the block type determination section; a sine wave discrimination section for discriminating whether or not the input signal is a sine wave, by using the MDCT frequency spectrum calculated by the MDCT processing section; an SMR operation section for calculating an SMR by using the FFT frequency spectrum calculated by the FFT operation section; an allowable error amount calculation section for calculating an allowable amount of error by using the SMR and the MDCT frequency spectrum; a switching section for switching between use and nonuse of an output value from the allowable error amount calculation section based on the result of sine wave discrimination in the sine wave discrimination section; a bit amount/error amount control section for determining a scale factor by performing bit amount/error amount control based on an amount of error from the allowable error amount calculation section, a dequantized value from a quantization section and an amount of used bits from a Huffman encoding section; a normalization processing section for normalizing the MDCT frequency spectrum from the MDCT processing section based on the scale factor from the bit amount/error amount control section; the quantization section for quantizing and dequantizing the MDCT frequency spectrum normalized by the normalization processing section; the Huffman encoding section for performing Huffman encoding of the quantized MDCT frequency spectrum to output a Huffman code book number and a Huffman code and to calculate an amount of used bits; and a multiplexer section for multiplexing the processing block type from the block type determination section, the scale factor from the bit amount/error amount control section, the Huffman code book number and the Huffman code from the Huffman encoding section.

In a preferred form of the fourth aspect of the present invention, the audio signal encoding apparatus further comprises a switching section for switching between execution and stop of the calculation processing of the SMR operation section based on the result of sine wave discrimination in the sine wave discrimination section.

In another preferred form of the fourth aspect of the present invention, when the output value from the allowable error amount calculation section is not used, a preset allowable error amount value is used in the switching section for switching between use and nonuse of an output value from the allowable error amount calculation section based on the result of sine wave discrimination in the sine wave discrimination section.

In a further preferred form of the third or fourth aspect of the present invention, the MDCT frequency spectrum used for sine wave discrimination in the sine wave discrimination section is a power spectrum.

According to a fifth aspect of the present invention, there is provided an audio signal encoding apparatus comprising: an FFT operation section for performing FFT operation processing of an input signal; a block type determination section for determining a processing block type of an MDCT processing section by using an FFT frequency spectrum calculated by the FFT operation section; an MDCT processing section for calculating an MDCT frequency spectrum by performing frequency orthogonal transformation processing of the input signal based on the processing block type received from the block type determination section; a sine wave discrimination section for discriminating whether or not the input signal is a sine wave, by using the input signal; an SMR operation section for calculating an SMR by using the FFT frequency spectrum calculated by the FFT operation section; a switching section for switching between use and nonuse of an output value from the SMR operation section based on the result of sine wave discrimination in the sine wave discrimination section; an allowable error amount calculation section for calculating an allowable amount of error by using the SMR and the MDCT frequency spectrum; a bit amount/error amount control section for determining a scale factor by performing bit amount/error amount control based on an amount of error from the allowable error amount calculation section, a dequantized value from a quantization section and an amount of used bits from a Huffman encoding section; a normalization processing section for normalizing the MDCT frequency spectrum from the MDCT processing section based on the scale factor from the bit amount/error amount control section; the quantization section for quantizing and dequantizing the MDCT frequency spectrum normalized by the normalization processing section; the Huffman encoding section for performing Huffman encoding of the quantized MDCT frequency spectrum to output a Huffman code book number and a Huffman code and to calculate an amount of used bits; and a multiplexer section for multiplexing the processing block type from the block type determination section, the scale factor from the bit amount/error amount control section, the Huffman code book number and the Huffman code from the Huffman encoding section.

In a preferred form of the fifth aspect of the present invention, the audio signal encoding apparatus further comprises a switching section for switching between execution and stop of the calculation processing of the SMR operation section based on the result of sine wave discrimination in the sine wave discrimination section.

In another preferred form of the fifth aspect of the present invention, when the output value from the SMR operation section is not used, a preset SMR value is used in the switching section for switching between use and nonuse of an output value from the SMR operation section based on the result of sine wave discrimination in the sine wave discrimination section.

According to a sixth aspect of the present invention, there is provided an audio signal encoding apparatus comprising: an FFT operation section for performing FFT operation processing of an input signal; a block type determination section for determining a processing block type of an MDCT processing section by using an FFT frequency spectrum calculated by the FFT operation section; an MDCT processing section for calculating an MDCT frequency spectrum by performing frequency orthogonal transformation processing of the input signal based on the processing block type received from the block type determination section; a sine wave discrimination section for discriminating whether or not the input signal is a sine wave, by using the input signal; an SMR operation section for calculating an SMR by using the FFT frequency spectrum calculated by the FFT operation section; an allowable error amount calculation section for calculating an allowable amount of error by using the SMR and the MDCT frequency spectrum; a switching section for switching between use and nonuse of an output value from the allowable error amount calculation section based on the result of sine wave discrimination in the sine wave discrimination section; a bit amount/error amount control section for determining a scale factor by performing bit amount/error amount control based on an amount of error from the allowable error amount calculation section, a dequantized value from a quantization section and an amount of used bits from a Huffman encoding section; a normalization processing section for normalizing the MDCT frequency spectrum from the MDCT processing section based on the scale factor from the bit amount/error amount control section; the quantization section for quantizing and dequantizing the MDCT frequency spectrum normalized by the normalization processing section; the Huffman encoding section for performing Huffman encoding of the quantized MDCT frequency spectrum to output a Huffman code book number and a Huffman code and to calculate an amount of used bits; and a multiplexer section for multiplexing the processing block type from the block type determination section, the scale factor from the bit amount/error amount control section, the Huffman code book number and the Huffman code from the Huffman encoding section.

In a preferred form of the sixth aspect of the present invention, the audio signal encoding apparatus further comprises a switching section for switching between execution and stop of the calculation processing of the SMR operation section based on the result of sine wave discrimination in the sine wave discrimination section.

In another preferred form of the sixth aspect of the present invention, when the output value from the allowable error amount calculation section is not used, a preset allowable error amount value is used in the switching section for switching between use and nonuse of an output value from the allowable error amount calculation section based on the result of sine wave discrimination in the sine wave discrimination section.

The above and other objects, features and advantages of the present invention will become more readily apparent to those skilled in the art from the following detailed description of preferred embodiments of the present invention taken in conjunction with the accompanying drawings.

DESCRIPTION OF THE PREFERRED EMBODIMENTS

Now, preferred embodiments of the present invention will be described in detail while referring to the accompanying drawings.

Embodiment 1

Figure 1:
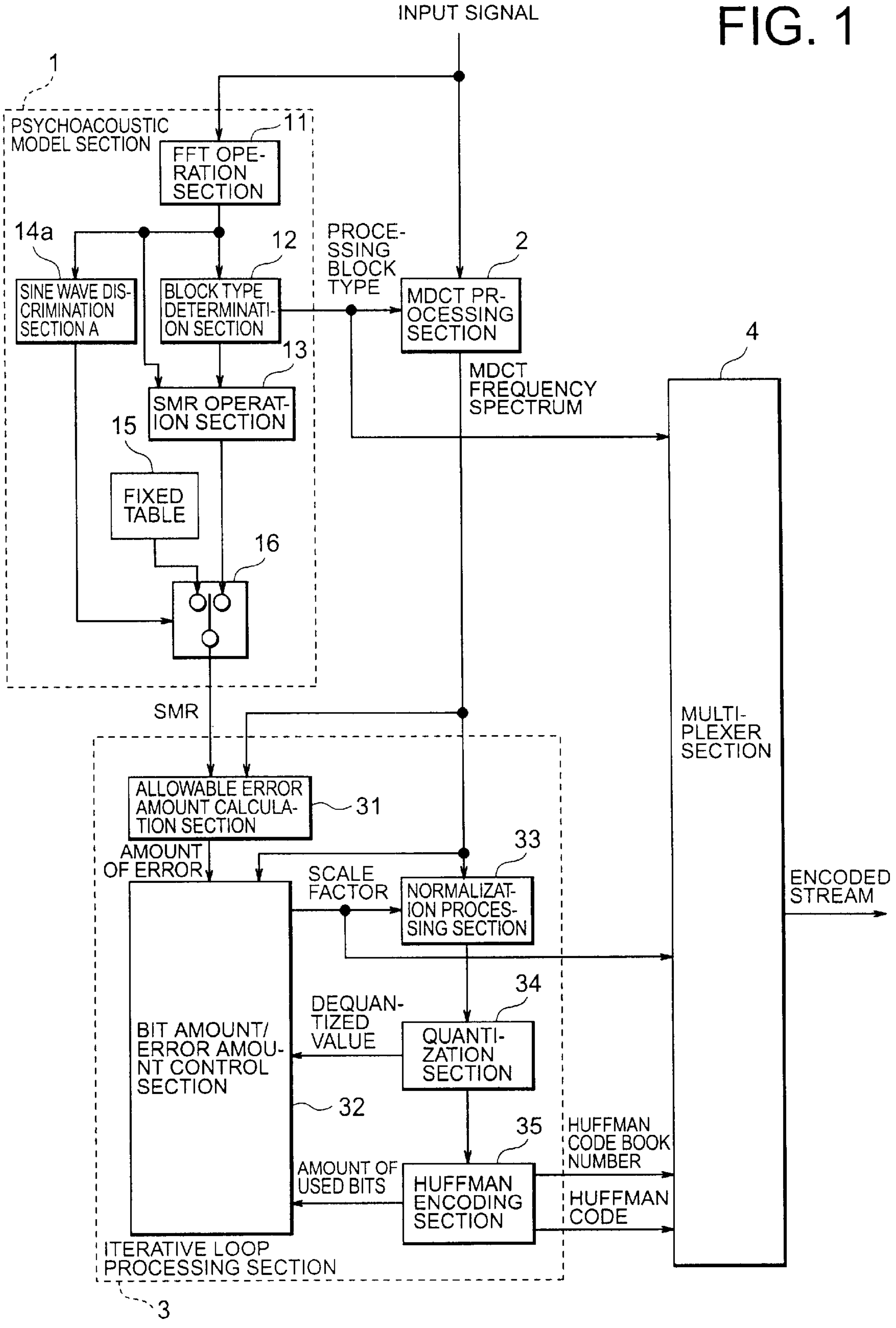
FIG. 1 is a block diagram illustrating an audio signal encoding apparatus according to a first embodiment of the present invention.

FIG. 1 illustrates a block diagram of an audio signal encoding apparatus according to a first embodiment of the present invention. In this figure, the same or corresponding parts of this embodiment as those of the above-mentioned conventional apparatus will be identified by the same symbols. In FIG. 1, the audio signal encoding apparatus of this embodiment includes, in addition to the same components as those of the aforementioned conventional apparatus, a sine wave discrimination section A 14*a*, a fixed table 15, and a switch 16 for selectively connecting the allowable error amount calculation section 31 either with the SMR operation section 13 or with the fixed table 15.

Next, the operation of this embodiment will be described below.

An input signal input to the psychoacoustic model section 1 is subjected to the FFT operation processing in the FFT operation section 11 to generate an FFT frequency spectrum.

The block type determination section 12 calculates a masking threshold from the FFT frequency spectrum output from the FFT operation section 11, determines the block type of the input signal based on the masking threshold thus obtained, and passes the result of determination to the MDCT processing section 2 and the multiplexer section 4 as a processing block type.

Then, the SMR operation section 13 calculates an SMR based on the FFT frequency spectrum from the FFT operation section 11 and the masking threshold in the block type determination section 12, and outputs the SMR thus generated to the switch 16.

Figure 2:
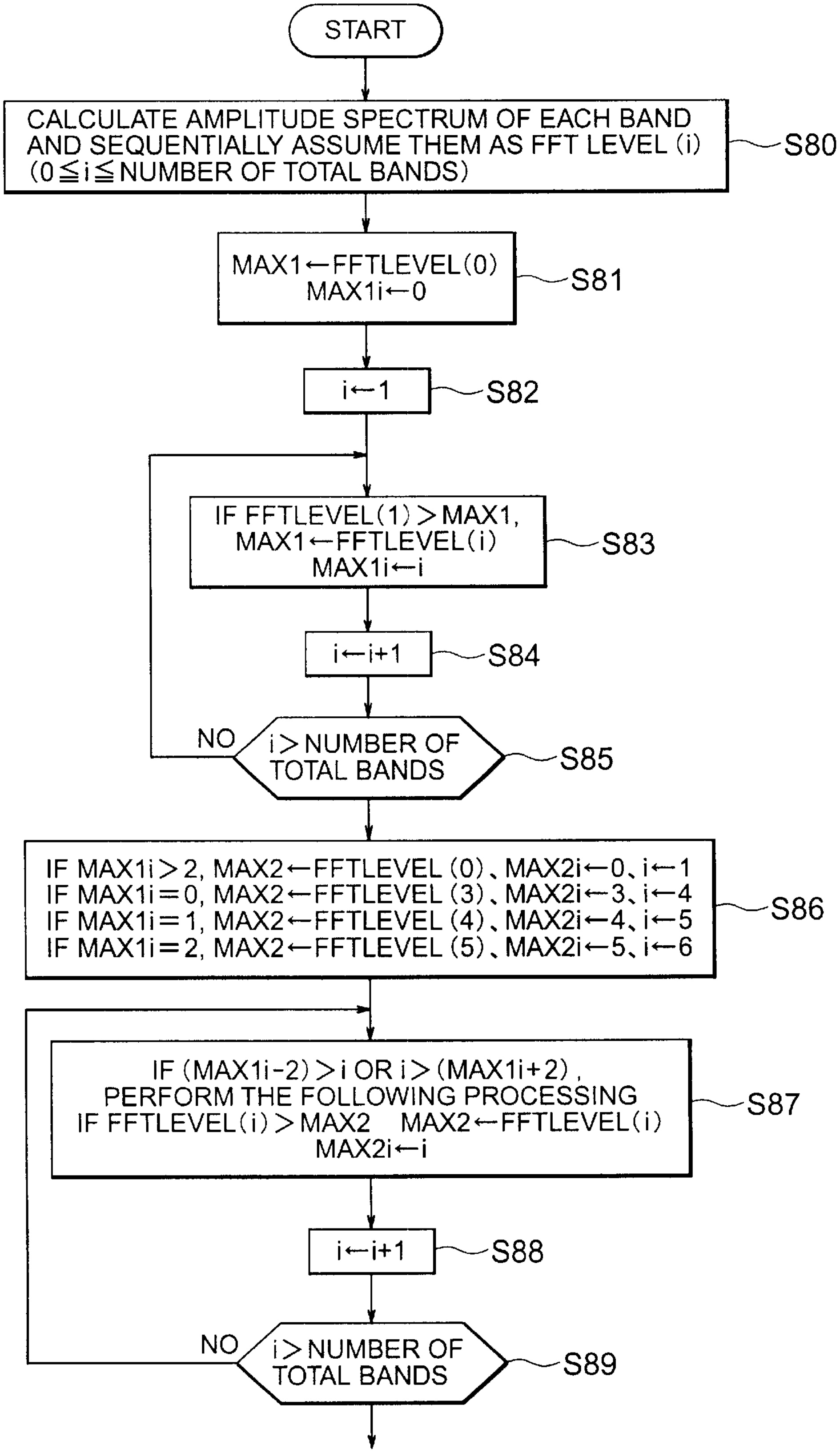
FIG. 2 is a flow chart of the processing carried out by a sine wave discrimination section according to the present invention.
Figure 3:
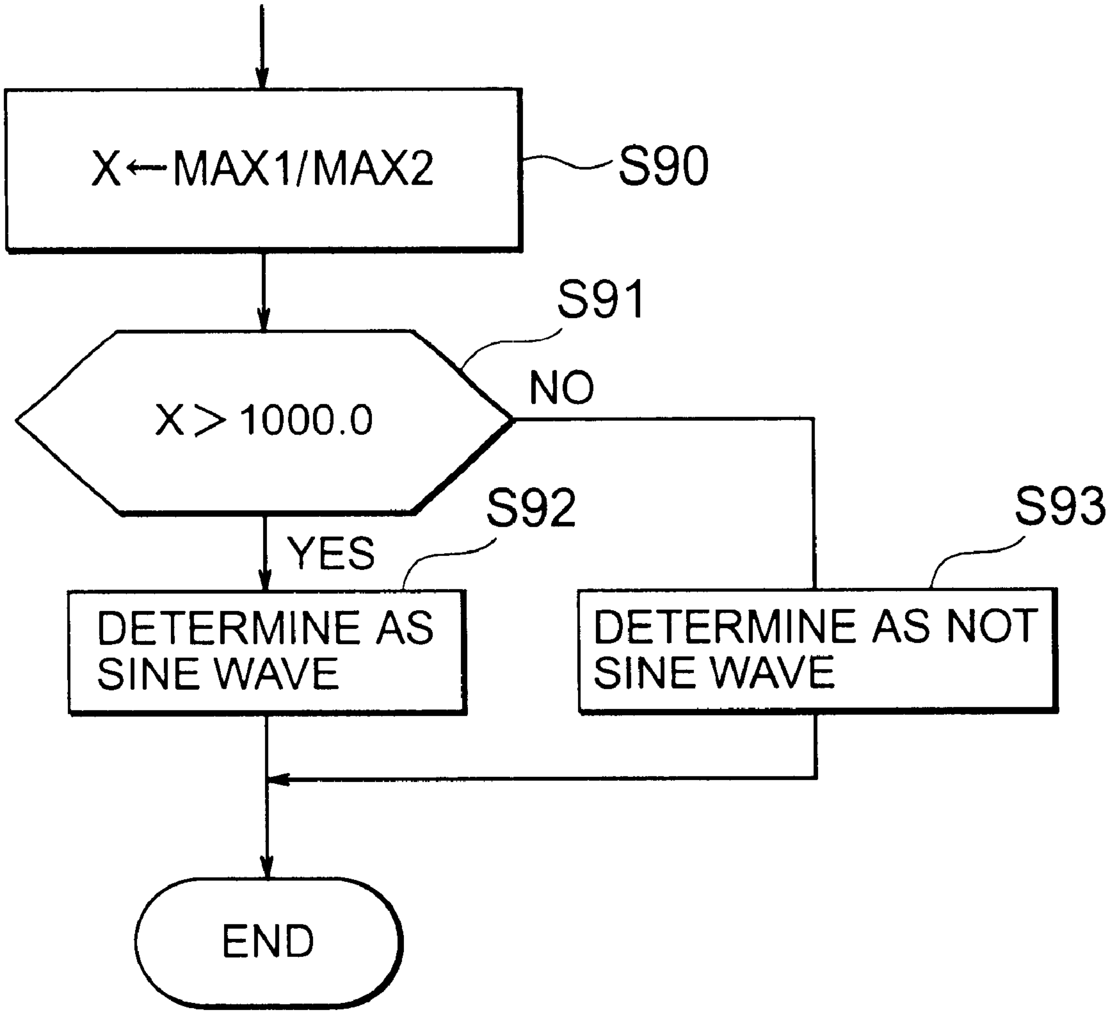
FIG. 3 is a flow chart which is a continuation of the flow chart of the processing carried out by the sine wave discrimination section according to the present invention as illustrated in FIG. 2.

By using the FFT frequency spectrum from the FFT operation section 11, the sine wave discrimination section A 14*a* makes a discrimination as to whether or not a signal component of the input signal is a sine wave, and when it is discriminated that the signal component of the input signal is a sine wave, the switch 16 is switched into connection with the fixed table 15, which stores in advance SMRs of preset fixed values. On the other hand, when it is discriminated that the signal component of the input signal is not a sine wave, the switch 16 is switched into connection with the SMR operation section 13. An example of the method of discriminating the sine wave will be explained below by using flow charts of FIGS. 2 and 3.

First of all, the square root of the squared sum of the real number component and the imaginary number component, i.e., amplitude spectrum, of the FFT frequency spectrum obtained by the FFT operation section 11 is calculated, and then an amplitude spectrum (i.e., corresponding to FFTlevel (i)) for each band is calculated (step S80). Here, note that the term "band" referred to herein means a group of frequency spectrums which exist in a preset frequency band and are bundled together to form a group, the band being set narrower in a low frequency side and wider in a higher frequency side according to the human auditory characteristics.

Next, max1, which stores a maximum amplitude spectrum value among all the bands, and the value of band 0 as an initial setting of its index value max1*i* are set as follows (step S81):

max1←FFTlevel(0) and max1*i*←0

In addition, the value of a counter i is set to "1" (step S82).

In step S83, a comparison is made between FFTlevel(i) and max1, and when FFTlevel(i) is greater than max1, the value of max1 and the value of max1*i* are updated.

After "1" is added to the value of i (step S84), it is determined whether the value of i thus added by "1" is greater than the number of the total bands (step S85). When this condition is not satisfied, a return is made to step S83 so that the processing of step S83 through step S85 is repeated.

Subsequently, max2, which stores a maximum amplitude spectrum among all the bands excepting two bands preceding (before) and following (after) the band max1*i*, and its index value max2*i* are subjected to initial setting (step S86). Here, the reason for excluding the two bands before and after the band max1*i* will be detailed.

The method of discriminating the sine wave presently taken as an example uses, as an index of determination, a relative ratio between the amplitude value of one band, which takes the greatest amplitude spectrum among all the bands, and the amplitude value of another band, which takes the second greatest amplitude spectrum among all the bands. Here, the problem is that there is a tendency that when max1*i* takes a maximum amplitude spectrum, the spectrums in the neighborhood of its frequency also become high, and hence it might be determined that the frequency component of one of these neighboring spectrums is the second greatest amplitude spectrum among all the bands. In this embodiment, therefore, in order to prevent this, the two bands before and after the band which takes the maximum amplitude value are excluded from the determination of the second greatest amplitude spectrum.

The processing in step S87 varies according to whether the following condition is satisfied or not:

the value of i is smaller than (max1*i*−2) or the value of i is greater than (max1*i*+2).

When the above condition is satisfied, a comparison is made between FFTlevel(i) and max2 as in step S83, and when FFTlevel(i) is greater than max2, the value of max2 and the value of max2*i* are updated, and thereafter the control process proceeds to step 88. On the other hand, when the above condition is not satisfied, the control process proceeds to step 88 without updating the value of max2 and the value of max2*i*.

After "1" is added to the value of i in step S88, it is determined whether the value of i is greater than the number of the total bands (step S89). When this condition is not satisfied, a return is made to step S87 so that the processing in steps S87 through S89 is repeated.

Subsequently, max1 is divided by max2, and the result or relative ratio between max1 and max2 is stored as "x" (step S90).

In step S91, a comparison is made between "x" and a preset threshold (e.g., 1000.0 in the example of FIG. 3), and when this condition is satisfied, it is determined that the input signal is a sine wave (S92), whereas when the condition is not satisfied, it is determined that the input signal is not sine wave (step S93). The foregoing is one example of the method of determining whether or not the input signal is a sine wave.

Reverting now to FIG. 1, although the following operations are basically the same as those of the conventional apparatus, the MDCT processing section 2 performs frequency orthogonal transformation processing based on the processing block type received from the block type determination section 12, and supplies an MDCT frequency spectrum generated as a result of this processing to the allowable error amount calculation section 31 and the normalization processing section 33 in the iterative loop processing section 3.

The allowable error amount calculation section 31 in the iterative loop processing section 3 carries out multiplication between the MDCT frequency spectrum and the reciprocal (1/SMR) of SMR so as to calculate an allowable amount of error. Note that the amount of error as referred to herein represents a difference between the MDCT frequency spectrum from the MDCT processing section 2 and the dequantized value generated through quantization/dequantization, i.e., a quantizing error, and as long as this value remains within an allowable range, noise can not be perceived by the human ear.

The amount of error calculated in the allowable error amount calculation section 31 is passed to the bit amount/error amount control section 32, where it is used as an index of determination as to whether the MDCT frequency spectrum generated through quantization/dequantization satisfies the allowable amount of error.

The normalization processing section 33 performs the normalization of the MDCT frequency spectrum passed from the MDCT processing section 2 by using a scale factor selected in the bit amount/error amount control section 32.

The quantization section 34 performs the quantization of the MDCT frequency spectrum normalized in the normalization processing section 33, and passes the result of quantization to the Huffman encoding section 35. In addition, the quantization section 34 also performs the dequantization of the quantized MDCT frequency spectrum and passes the result of dequantization to the bit amount/error amount control section 32 in order to calculate an amount of error in the quantization.

The Huffman encoding section 35 performs the Huffman encoding of the quantized MDCT frequency spectrum, and passes an amount of bits actually needed to the bit amount/error amount control section 32, and a Huffman code book number as well as a Huffman code to the multiplexer section 4.

The bit amount/error amount control section 32 calculates a difference between the MDCT frequency spectrum from the MDCT processing section 2 and the dequantized MDCT frequency spectrum obtained from the quantization section 34, i.e., an amount of error due to the quantization, and compares it with an allowable amount of error calculated in the allowable error amount calculation section 31. As a result, when it is determined that the amount of error due to the quantization is greater than the allowable amount of error, the value of the scale factor is reduced and then passed to the normalization processing section 33.

On the other hand, when it is determined that the amount of error due to the quantization is smaller than the allowable amount of error, a comparison is made between the amount of used bits obtained from the Huffman encoding section 35 and the allowable amount of bits calculated from the bit rate specified upon encoding. As a result, when it is determined that the amount of used bits is greater than the allowable amount of bits, the value of the scale factor is increased and then passed to the normalization processing section 33. On the other hand, when it is determined that the amount of used bits is smaller than the allowable amount of bits, the processing in the iterative loop processing section 3 is ended, and the control process is shifted to multiplex processing.

As described in the foregoing, the processing in the iterative loop processing section 3, which is constituted by the allowable error amount calculation section 31, the bit amount/error amount control section 32, the normalization processing section 33, the quantization section 34 and the Huffman encoding section 35, is reiterated until when the quantized MDCT frequency spectrum actually falls below the allowable amount of error, and when the amount of bits required for quantization actually falls below the allowable amount of bits.

Thereafter, the quantized and Huffman-encoded MDCT frequency spectrum, together with ancillary information such as a header, the processing block type determined by the block type determination section 12, the scale factor selected by the bit amount/error amount control section 32 and the Huffman code book number selected by the Huffman encoding section 35, is subjected to the multiplex processing in the multiplexer section 4, so that it is transformed into a coded stream and then sent out to a transmission line.

In the foregoing, an explanation has been given to the details of the processing in the encoding processing section. In cases where the width of a band in which the frequency component such as a sine wave of a signal to be processed exists is narrow, by using the above processing scheme, it is possible to replace parameters from a psychoacoustic model generated based on the human auditory characteristics with those by which the signal can be effectively quantized, thereby preventing deterioration in the objective characteristics of the signal.

Moreover, the above description is based on the premise that the amplitude spectrum of the square root of the squared sum of the real number component and the imaginary number component of the FFT frequency spectrum calculated in the FFT operation is used as a criterion for sine wave discrimination, but instead there may be utilized as such a criterion the squared sum of the real number component and the imaginary number component of the FFT frequency spectrum, i.e., power spectrum, while providing the same effects.

In addition, although in the above description it is presupposed that the amplitude spectrum of the square root of the squared sum of the real number component and the imaginary number component of the FFT frequency spectrum calculated in the FFT operation is used as a criterion for sine wave discrimination, such a calculation of the squared sum may be omitted, and instead of using the squared sum, the real number component or the imaginary number component alone may be utilized, that is, the absolute value of the real number component or the imaginary number component may be used for instance, while providing the similar effects with a reduced amount of calculations.

Embodiment 2

Figure 4:
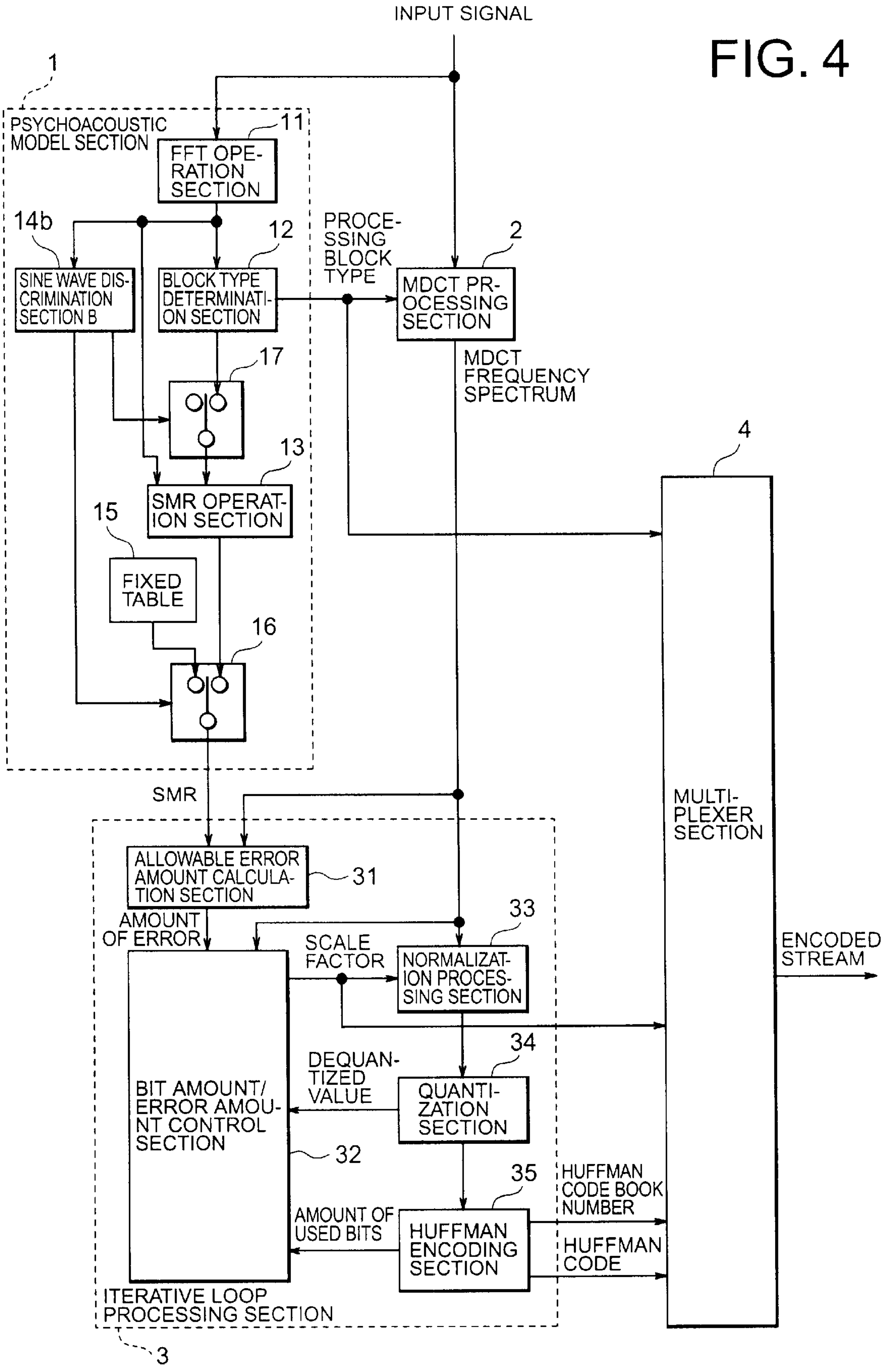
FIG. 4 is a block diagram illustrating an audio signal encoding apparatus according to a second embodiment of the present invention.

FIG. 4 illustrates a block diagram of an audio signal encoding apparatus according to a second embodiment of the present invention. The same or corresponding parts of this embodiment as those of the above-mentioned first embodiment will be identified by the same symbols. In FIG. 4, reference symbol **14*b* designates a sine wave discrimination section B; reference numeral 15 designates a fixed table; and reference numerals 16 and 17** designate switches.

Now, reference will be made to the operation of this second embodiment. An input signal input to the psychoacoustic model section 1 is subjected to the FFT operation processing in the FFT operation section 11 to generate an FFT frequency spectrum.

The block type determination section 12 calculates a masking threshold from the FFT frequency spectrum from the FFT operation section 11, determines the block type of the input signal based on the masking threshold, and supplies the result to the MDCT processing section 2 and the multiplexer section 4 as a processing block type.

Only when the switch 17 is connected with the block type determination section 12, the SMR operation section 13 calculates an SMR based on the FFT frequency spectrum from the FFT operation section 11 and the masking threshold in the block type determination section 12, and passes the resultant SMR thus generated to the switch 16.

Using the FFT frequency spectrum from the FFT operation section 11, the sine wave discrimination section B **14*b* makes a discrimination as to whether the signal component of the input signal is a sine wave or is not, and when it is discriminated that the signal component of the input signal is a sine wave, the switch 17 is switched into connection with the non-connected side, thereby stopping the processing in the SMR operation section 13. In addition, the switch 16 is switched into connection with the fixed table 15**, which stores in advance SMRs of preset fixed values.

On the other hand, when it is discriminated that the signal component of the input signal is not a sine wave, the switch 17 is switched into connection with the block type determination section 12, and the switch 16 is also switched into connection with the SMR operation section 13 side. The method of discriminating the sine wave has already been described in detail in the aforementioned first embodiment, and hence a description thereof is omitted here.

The MDCT processing section 2 carries out frequency orthogonal transformation processing based on the processing block type received from the block type determination section 12, and supplies an MDCT frequency spectrum generated as a result of such processing to the allowable error amount calculation section 31 and the normalization processing section 33 in the iterative loop processing section 3.

The operations carried out in the iterative loop processing section 3 are basically the same as those in the first embodiment, and thus the processing in the iterative loop processing section 3, which is constituted by the allowable error amount calculation section 31, the bit amount/error amount control section 32, the normalization processing section 33, the quantization processing section 34 and the Huffman encoding section 35, is reiterated until when the quantized MDCT frequency spectrum actually falls below the allowable amount of error, and when the amount of bits required for quantization falls below the allowable amount of bits.

Thereafter, the quantized and Huffman-encoded MDCT frequency spectrum together with ancillary information such as a header, the processing block type determined by the block type determination section 12, the scale factor selected by the bit amount/error amount control section 32 and the Huffman code book number selected by the Huffman encoding section 35 is subjected to the multiplex processing in the multiplexer section 4, so that it is transformed into a coded stream and then sent out to a transmission line.

In the foregoing, an explanation has been given to the details of the processing in the encoding processing section. In cases where the width of a band in which the frequency component such as a sine wave of a signal to be processed exists is narrow, by using the above processing scheme, it is possible to replace parameters from a psychoacoustic model generated based on the human auditory characteristics with those by which the signal can be effectively quantized, thereby preventing deterioration in the objective characteristics of the signal. Additionally, the processing of calculating the SMR can be omitted, thus providing an effect of reducing the amount of processing.

Moreover, the above description is based on the premise that the amplitude spectrum of the square root of the squared sum of the real number component and the imaginary number component of the FFT frequency spectrum calculated in the FFT operation is used as a criterion for sine wave discrimination, but instead there may be utilized as such a criterion the squared sum of the real number component and the imaginary number component of the FFT frequency spectrum, i.e., power spectrum, while providing the same effects.

In addition, although in the above description it is presupposed that the amplitude spectrum of the square root of the squared sum of the real number component and the imaginary number component of the FFT frequency spectrum calculated in the FFT operation is used as a criterion for sine wave discrimination, such a calculation of the squared sum may be omitted, and instead of using the squared sum, the real number component or the imaginary number component alone may be utilized, that is, the absolute value of the real number component or the imaginary number component may be used for instance, while providing the similar effects with a reduced amount of calculations.

Embodiment 3

Figure 5:
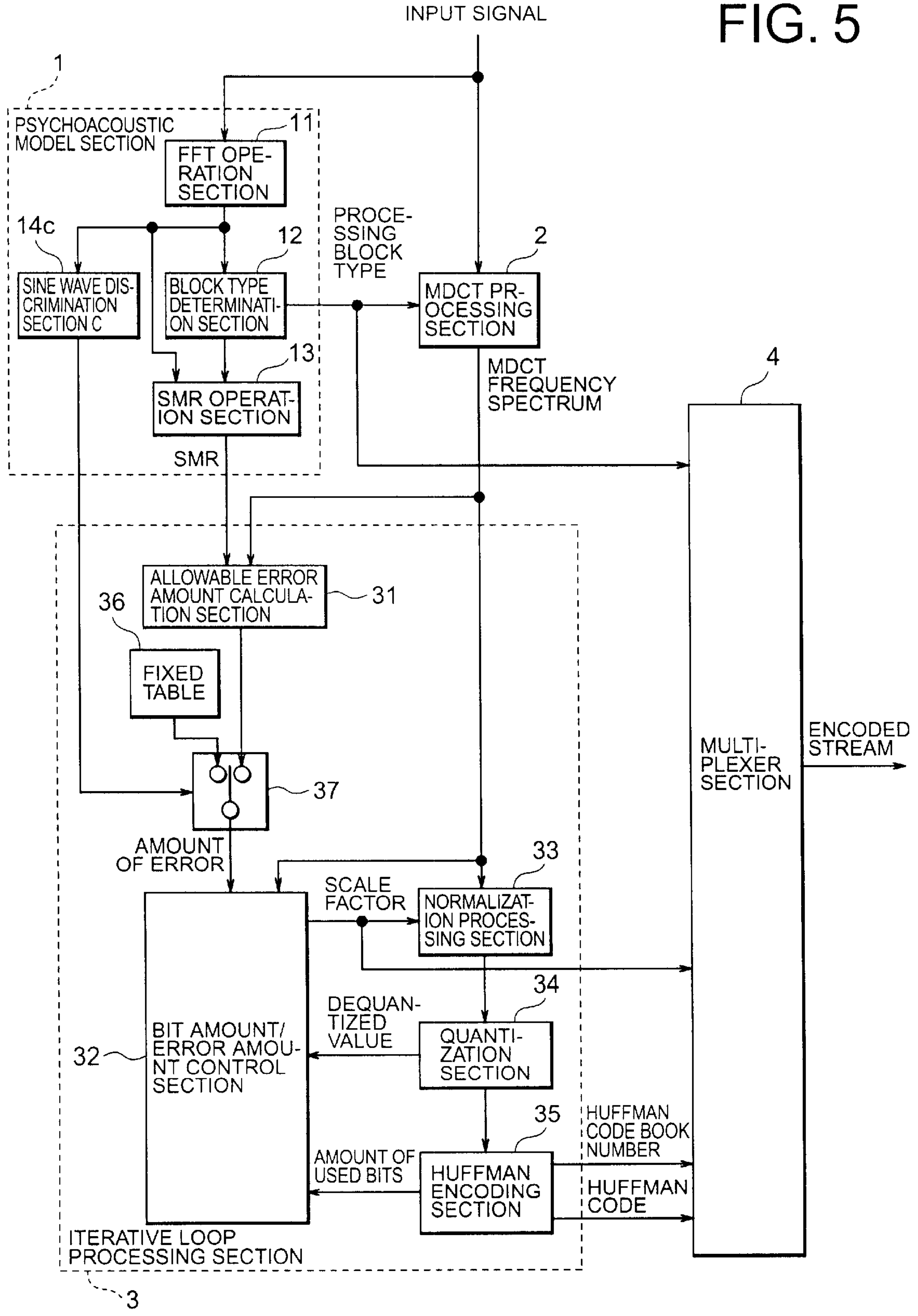
FIG. 5 is a block diagram illustrating an audio signal encoding apparatus according to a third embodiment of the present invention.

FIG. 5 illustrates a block diagram of an audio signal encoding apparatus according to a third embodiment of the present invention. The same or corresponding parts of this embodiment as those of the above-mentioned first embodiment will be identified by the same symbols. In FIG. 5, reference symbol 14*c* designates a sine wave discrimination section C in the psychoacoustic model section 1, and reference numeral 37 designates a switch in the iterative loop processing section 3.

Now, reference will be made to the operation of this third embodiment.

The operations of the FFT operation section 11, the block type determination section 12 and the SMR operation section 13 in the psychoacoustic model section 1 in this embodiment are the same as those of the aforementioned embodiments.

Using the FFT frequency spectrum from the FFT operation section 11, the sine wave discrimination section C 14*c* makes a discrimination as to whether or not the signal component of an input signal is a sine wave. When it is discriminated that the signal component of an input signal is a sine wave, the switch 37 is switched into connection with the fixed table 36, which stores allowable amounts of error in the form of preset fixed values.

On the other hand, when it is discriminated that the signal component of an input signal is not a sine wave, the switch 37 is switched into connection with the allowable error amount calculation section 31. The method of discriminating the sine wave has already been described in detail in the aforementioned first embodiment, and hence a description thereof is omitted here.

The MDCT processing section 2 carries out frequency orthogonal transformation processing based on the processing block type received from the block type determination section 12, and supplies an MDCT frequency spectrum generated as a result of such processing to the allowable error amount calculation section 31 and the normalization processing section 33 in the iterative loop processing section 3.

The allowable error amount calculation section 31 in the iterative loop processing section 3 carries out multiplication between the MDCT frequency spectrum and the reciprocal (1/SMR) of SMR so as to calculate an allowable amount of error. Note that the amount of error as referred to herein represents a difference between the MDCT frequency spectrum from the MDCT processing section 2 and the dequantized value generated through quantization/dequantization, i.e., a quantizing error, and as long as this value remains within an allowable range, noise can not be perceived by the human ear.

The amount of error obtained by the switch 37 under the control of the sine wave discrimination section C 14*c* is passed to the bit amount/error amount control section 32, where it is used as an index of determination as to whether the MDCT frequency spectrum generated through quantization/dequantization satisfies the allowable amount of error.

The normalization processing section 33 performs the normalization of the MDCT frequency spectrum passed from the MDCT processing section 2 by using a scale factor selected in the bit amount/error amount control section 32.

The quantization section 34 performs the quantization of the MDCT frequency spectrum normalized in the normalization processing section 33, and passes the result of quantization to the Huffman encoding section 35. In addition, the quantization section 34 also performs the dequantization of the quantized MDCT frequency spectrum and passes the result of dequantization to the bit amount/error amount control section 32 in order to calculate an amount of error in the quantization.

The Huffman encoding section 35 performs the Huffman encoding of the quantized MDCT frequency spectrum, and passes an amount of bits actually needed to the bit amount/error amount control section 32, and a Huffman code book number as well as a Huffman code to the multiplexer section 4.

The bit amount/error amount control section 32 calculates a difference between the MDCT frequency spectrum from the MDCT processing section 2 and the dequantized MDCT frequency spectrum obtained from the quantization section 34, i.e., an amount of error due to the quantization, and compares it with the allowable amount of error calculated in the allowable error amount calculation section 31. As a result, when it is determined that the amount of error due to the quantization is greater than the allowable amount of error, the value of the scale factor is reduced and then passed to the normalization processing section 33.

On the other hand, when it is determined that the amount of error due to the quantization is smaller than the allowable amount of error, a comparison is made between the amount of used bits obtained from the Huffman encoding section 35 and the allowable amount of bits calculated from the bit rate specified upon encoding. As a result, when it is determined that the amount of used bits is greater than the allowable amount of bits, the value of the scale factor is increased and then passed to the normalization processing section 33. On the other hand, when it is determined that the amount of used bits is smaller than the allowable amount of bits, the processing in the iterative loop processing section 3 is ended, and the control process is shifted to the multiplex processing.

As described in the foregoing, the processing in the iterative loop processing section 3, which is constituted by the allowable error amount calculation section 31, the bit amount/error amount control section 32, the normalization processing section 33, the quantization section 34 and the Huffman encoding section 35, is reiterated until when the quantized MDCT frequency spectrum actually falls below the allowable amount of error, and when the amount of bits required for quantization actually falls below the allowable amount of bits.

Thereafter, the quantized and Huffman-encoded MDCT frequency spectrum together with ancillary information such as a header, the processing block type determined by the block type determination section 12, the scale factor selected by the bit amount/error amount control section 32 and the Huffman code book number selected by the Huffman encoding section 35 is subjected to the multiplex processing in the multiplexer section 4, so that it is transformed into a coded stream and then sent out to a transmission line.

In the foregoing, an explanation has been given to the details of the processing in the encoding processing section.

In cases where the width of a band in which the frequency component such as a sine wave of a signal to be processed exists is narrow, by using the above processing scheme, it is possible to replace parameters from a psychoacoustic model generated based on the human auditory characteristics with those by which the signal can be effectively quantized, thereby preventing deterioration in the objective characteristics of the signal.

Moreover, the above description is based on the premise that the amplitude spectrum of the square root of the squared sum of the real number component and the imaginary number component of the FFT frequency spectrum calculated in the FFT operation is used as a criterion for sine wave discrimination, but instead there may be utilized as such a criterion the squared sum of the real number component and the imaginary number component of the FFT frequency spectrum, i.e., power spectrum, while providing the same effects.

In addition, although in the above description it is presupposed that the amplitude spectrum of the square root of the squared sum of the real number component and the imaginary number component of the FFT frequency spectrum calculated in the FFT operation is used as a criterion for sine wave discrimination, such a calculation of the squared sum may be omitted, and instead of using the squared sum, the real number component or the imaginary number component alone may be utilized, that is, the absolute value of the real number component or the imaginary number component may be used for instance, while providing the similar effects with a reduced amount of calculations.

Embodiment 4

Figure 6:
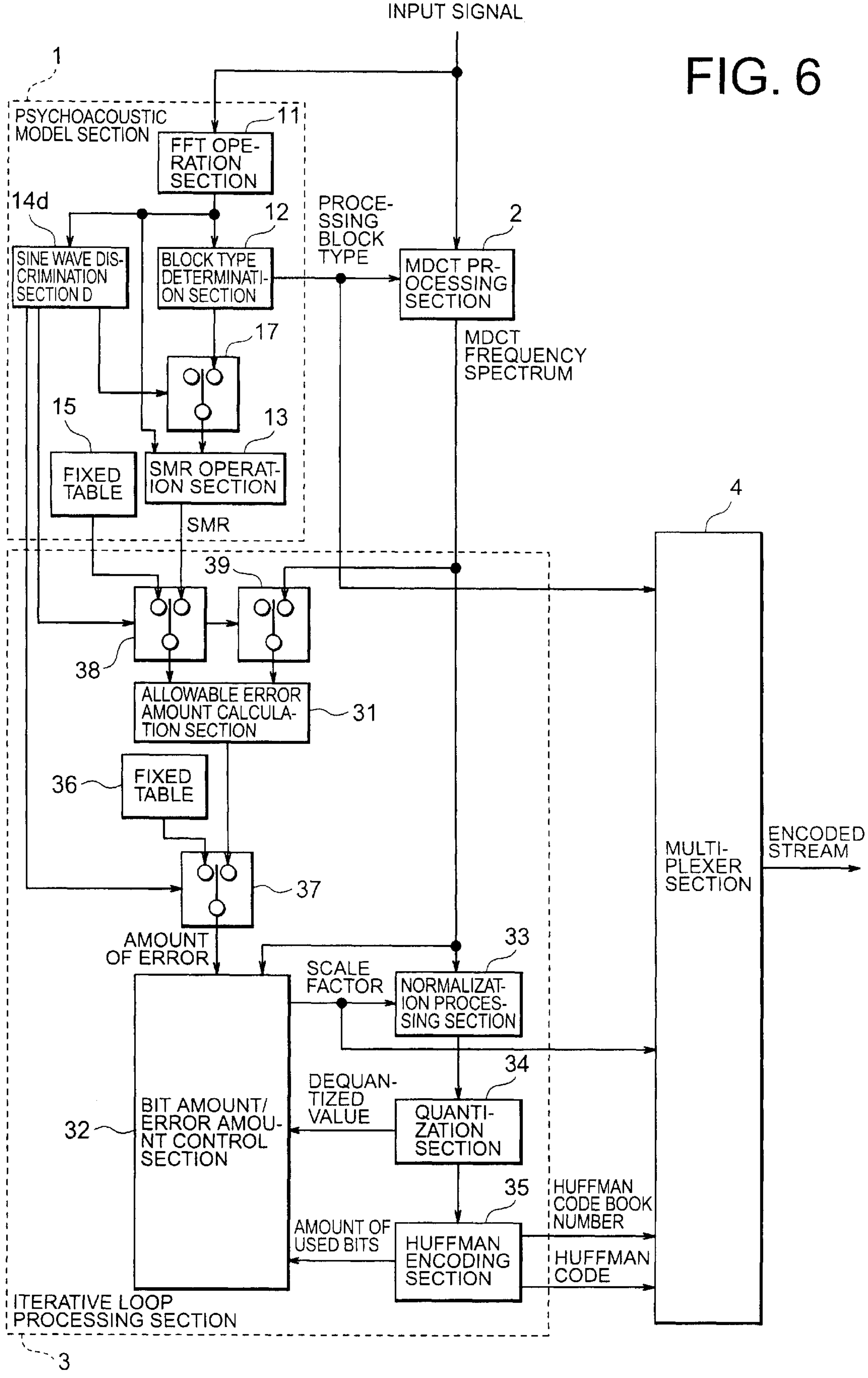
FIG. 6 is a block diagram illustrating an audio signal encoding apparatus according to a fourth embodiment of the present invention.

FIG. 6 illustrates a block diagram of an audio signal encoding apparatus according to a fourth embodiment of the present invention. The same or corresponding parts of this embodiment as those of the abovementioned embodiments will be identified by the same symbols. In FIG. 6, reference symbol 14*d* designates a sine wave discrimination section D; reference numerals 15 and 36 designate fixed tables; reference numerals 17, 37, 38 and 39 designate switches; and reference numeral 4 designates a multiplexer section.

Now, reference will be made to the operation of this fourth embodiment.

An input signal input to the psychoacoustic model section 1 is subjected to the FFT operation processing in the FFT operation section 11 to generate an FFT frequency spectrum.

The block type determination section 12 calculates a masking threshold from the FFT frequency spectrum from the FFT operation section 11, determines the block type of the input signal based on the masking threshold, and supplies the result to the MDCT processing section 2 and the multiplexer section 4 as a processing block type.

Only when the switch 17 is connected with the block type determination section 12, the SMR operation section 13 calculates an SMR based on the FFT frequency spectrum from the FFT operation section 11 and the masking threshold in the block type determination section 12, and passes the resultant SMR thus generated to the switch 38.

Using the FFT frequency spectrum from the FFT operation section 11, the sine wave discrimination section D 14*d* makes a discrimination as to whether the signal component of the input signal is a sine wave or is not. When it is discriminated that the signal component of the input signal is a sine wave, the switch 17 is switched into connection with the non-connected side, thereby stopping the processing in the SMR operation section 13, and the switches 38 and 39 are both switched into connection with the non-connected sides, thereby stopping the processing in the allowable error amount calculation section 31. Also, the switch 37 is switched into connection with the fixed table 36, which stores allowable amounts of error in the form of preset fixed values.

On the other hand, when it is discriminated that the signal component of the input signal is not a sine wave, the switch 17 is switched into connection with the block type determination section 12, and the switches 38, 39 and 37 are also switched into connection with the SMR operation section 13, the MDCT processing section 2 and the allowable error amount calculation section 31, respectively. The method of discriminating the sine wave has already been described in detail in the aforementioned first embodiment, and hence a description thereof is omitted here.

The MDCT processing section 2 carries out frequency orthogonal transformation processing based on the processing block type received from the block type determination section 12, and supplies an MDCT frequency spectrum generated as a result of such processing to the switch 39 and the normalization processing section 33.

Using the SMR obtained from the switch 38 under the control of the sine wave discrimination section D 14*d* and the MDCT frequency spectrum obtained from the switch 39, the allowable error amount calculation section 31 in the iterative loop processing section 3 carries out multiplication between the MDCT frequency spectrum and the reciprocal (1/SMR) of SMR so as to calculate an allowable amount of error. Note that the amount of error as referred to herein represents a difference between the MDCT frequency spectrum from the MDCT processing section 2 and the dequantized value generated through quantization/dequantization, i.e., a quantizing error, and as long as this value remains within an allowable range, noise can not be perceived by the human ear.

The amount of error obtained from the switch 37 under the control of the sine wave discrimination section D 14*d* is passed to the bit amount/error amount control section 32, where it is used as an index of determination as to whether the MDCT frequency spectrum generated through quantization/dequantization satisfies the allowable amount of error.

The normalization processing section 33 performs the normalization of the MDCT frequency spectrum passed from the MDCT processing section 2 by using a scale factor selected in the bit amount/error amount control section 32.

The quantization section 34 performs the quantization of the MDCT frequency spectrum normalized in the normalization processing section 33, and passes the result of quantization to the Huffman encoding section 35. In addition, the quantization section 34 also performs the dequantization of the quantized MDCT frequency spectrum and passes the result of dequantization to the bit amount/error amount control section 32 in order to calculate an amount of error in the quantization.

The Huffman encoding section 35 performs the Huffman encoding of the quantized MDCT frequency spectrum, and passes an amount of bits actually needed to the bit amount/error amount control section 32, and a Huffman code book number as well as a Huffman code to the multiplexer section 4.

The bit amount/error amount control section 32 calculates a difference between the MDCT frequency spectrum from the MDCT processing section 2 and the dequantized MDCT frequency spectrum obtained from the quantization section 34, i.e., an amount of error due to the quantization, and compares it with the allowable amount of error calculated in the allowable error amount calculation section 31. As a result, when it is determined that the amount of error due to the quantization is greater than the allowable amount of error, the value of the scale factor is reduced and then passed to the normalization processing section 33.

On the other hand, when it is determined that the amount of error due to the quantization is smaller than the allowable amount of error, a comparison is made between the amount of used bits obtained from the Huffman encoding section 35 and the allowable amount of bits calculated from the bit rate specified upon encoding. As a result, when it is determined that the amount of used bits is greater than the allowable amount of bits, the value of the scale factor is increased and then passed to the normalization processing section 33. On the other hand, when it is determined that the amount of used bits is smaller than the allowable amount of bits, the processing in the iterative loop processing section 3 is ended, and the control process is shifted to the multiplex processing.

As described in the foregoing, the processing in the iterative loop processing section 3, which is constituted by the allowable error amount calculation section 31, the bit amount/error amount control section 32, the normalization processing section 33, the quantization section 34 and the Huffman encoding section 35, is reiterated until when the quantized MDCT frequency spectrum actually falls below the allowable amount of error, and when the amount of bits required for quantization actually falls below the allowable amount of bits.

Thereafter, the quantized and Huffman-encoded MDCT frequency spectrum together with ancillary information such as a header, the processing block type determined by the block type determination section 12, the scale factor selected by the bit amount/error amount control section 32 and the Huffman code book number selected by the Huffman encoding section 35 is subjected to the multiplex processing in the multiplexer section 4, so that it is transformed into a coded stream and then sent out to a transmission line.

In the foregoing, an explanation has been given to the details of the processing in the encoding processing section. In cases where the width of a band in which the frequency component such as a sine wave of a signal to be processed exists is narrow, by using the above processing scheme, it is possible to replace parameters from a psychoacoustic model generated based on the human auditory characteristics with those by which the signal can be effectively quantized, thereby preventing deterioration in the objective characteristics of the signal. Additionally, it is possible to omit the arithmetic operation processing for the SMR and the calculation processing for the allowable amount of error, thus providing an effect of reducing the amount of processing.

Moreover, the above description is based on the premise that the amplitude spectrum of the square root of the squared sum of the real number component and the imaginary number component of the FFT frequency spectrum calculated in the FFT operation is used as a criterion for sine wave determination, but instead there may be utilized as such a criterion the squared sum of the real number component and the imaginary number component of the FFT frequency spectrum, i.e., power spectrum, while providing the same effects.

In addition, although in the above description it is presupposed that the amplitude spectrum of the square root of the squared sum of the real number component and the imaginary number component of the FFT frequency spectrum calculated in the FFT operation is used as a criterion for sine wave discrimination, such a calculation of the squared sum may be omitted, and instead of using the squared sum, the real number component or the imaginary number component alone may be utilized, that is, the absolute value of the real number component or the imaginary number component may be used for instance, while providing the similar effects with a reduced amount of calculations.

Embodiment 5

Figure 7:
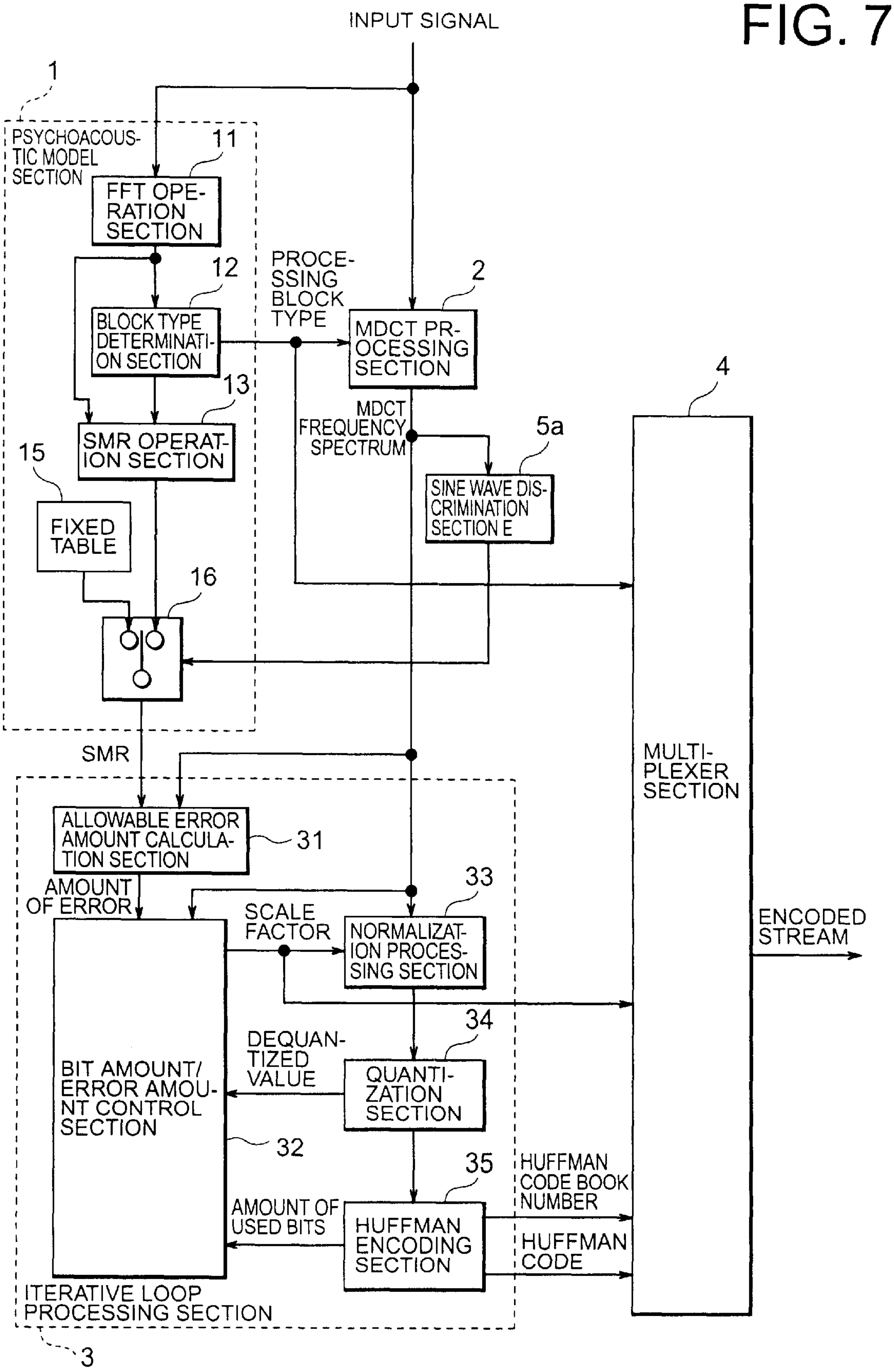
FIG. 7 is a block diagram illustrating an audio signal encoding apparatus according to a fifth embodiment of the present invention.

FIG. 7 illustrates a block diagram of an audio signal encoding apparatus according to a fifth embodiment of the present invention. The same or corresponding parts of this embodiment as those of the abovementioned embodiments will be identified by the same symbols. In FIG. 7, reference symbol **5*a* designates a sine wave discrimination section E; reference numeral 15 designates a fixed table; and reference numeral 16** designates a switch.

In the aforementioned first through fourth embodiments, the discrimination of a sine wave is made by using the FFT frequency spectrum which is calculated by the FFT operation section 11, but in the fifth through eighth embodiments to be described later, such a discrimination is made by using the MDCT frequency spectrum which is calculated by the MDCT processing section 2.

Now, reference will be made to the operation of this fifth embodiment.

An input signal input to the psychoacoustic model section 1 is subjected to the FFT operation processing in the FFT operation section 11 to generate an FFT frequency spectrum.

The block type determination section 12 calculates a masking threshold from the FFT frequency spectrum from the FFT operation section 11, determines the block type of the input signal based on the masking threshold, and supplies the result to the MDCT processing section 2 and the multiplexer section 4 as a processing block type.

The SMR operation section 13 calculates an SMR based on the FFT frequency spectrum from the FFT operation section 11 and the masking threshold in the block type determination section 12, and supplies the resultant SMR thus generated to the switch 16.

Subsequently, the MDCT processing section 2 carries out frequency orthogonal transformation processing based on the processing block type received from the block type determination section 12, and supplies an MDCT frequency spectrum generated as a result of such processing to the allowable error amount calculation section 31 and the normalization processing section 33 in the iterative loop processing section 3 and the sine wave discrimination section E **5*a***

Using the MDCT frequency spectrum from the MDCT processing section 2, the sine wave discrimination section E **5*a* makes a discrimination as to whether or not a signal component of the input signal is a sine wave, and when it is discriminated that the signal component of the input signal is a sine wave, the switch 16 is switched into connection with the fixed table 15**, which stores in advance SMRs of preset fixed values.

On the other hand, when it is discriminated that the signal component of the input signal is not a sine wave, the switch 16 is switched into connection with the SMR operation section 13. The method of discriminating the sine wave can be easily achieved by replacing the FFT amplitude spectrum used in the aforementioned sine wave discrimination method as described in detail in the first embodiment of the invention with the MDCT power spectrum. Thus, a detailed description thereof is omitted.

The allowable error amount calculation section 31 in the iterative loop processing section 3 carries out multiplication between the MDCT frequency spectrum and the reciprocal (1/SMR) of SMR so as to calculate an allowable amount of error. Note that the amount of error as referred to herein represents a difference between the MDCT frequency spectrum from the MDCT processing section 2 and the dequantized value generated through quantization/dequantization, i.e., a quantizing error, and as long as this value remains within an allowable range, noise can not be perceived by the human ear.

The amount of error calculated in the allowable error amount calculation section 31 is passed to the bit amount/error amount control section 32, where it is used as an index of determination as to whether the MDCT frequency spectrum generated through quantization/dequantization satisfies the allowable amount of error.

The normalization processing section 33 performs the normalization of the MDCT frequency spectrum passed from the MDCT processing section 2 by using a scale factor selected in the bit amount/error amount control section 32.

The quantization section 34 performs the quantization of the MDCT frequency spectrum normalized in the normalization processing section 33, and passes the result of quantization to the Huffman encoding section 35. In addition, the quantization section 34 also performs the dequantization of the quantized MDCT frequency spectrum and passes the result of dequantization to the bit amount/error amount control section 32 in order to calculate an amount of error in the quantization.

The Huffman encoding section 35 performs the Huffman encoding of the quantized MDCT frequency spectrum, and passes an amount of bits actually needed to the bit amount/error amount control section 32, and a Huffman code book number as well as a Huffman code to the multiplexer section 4.

The bit amount/error amount control section 32 calculates a difference between the MDCT frequency spectrum from the MDCT processing section 2 and the dequantized MDCT frequency spectrum obtained from the quantization section 34, i.e., an amount of error due to the quantization, and compares it with the allowable amount of error calculated in the allowable error amount calculation section 31. As a result, when it is determined that the amount of error due to the quantization is greater than the allowable amount of error, the value of the scale factor is reduced and then passed to the normalization processing section 33.

On the other hand, when it is determined that the amount of error due to the quantization is smaller than the allowable amount of error, a comparison is made between the amount of used bits obtained from the Huffman encoding section 35 and the allowable amount of bits calculated from the bit rate specified upon encoding. As a result, when it is determined that the amount of used bits is greater than the allowable amount of bits, the value of the scale factor is increased and then passed to the normalization processing section 33. On the other hand, when it is determined that the amount of used bits is smaller than the allowable amount of bits, the processing in the iterative loop processing section 3 is ended, and the control process is shifted to the multiplex processing.

As described in the foregoing, the processing in the iterative loop processing section 3, which is constituted by the allowable error amount calculation section 31, the bit amount/error amount control section 32, the normalization processing section 33, the quantization section 34 and the Huffman encoding section 35, is reiterated until when the quantized MDCT frequency spectrum actually falls below the allowable amount of error, and when the amount of bits required for quantization actually falls below the allowable amount of bits.

Thereafter, the quantized and Huffman-encoded MDCT frequency spectrum, together with ancillary information such as a header, the processing block type determined by the block type determination section 12, the scale factor selected by the bit amount/error amount control section 32 and the Huffman code book number selected by the Huffman encoding section 35, is subjected to the multiplex processing in the multiplexer section 4, so that it is transformed into a coded stream and then sent out to a transmission line.

In the foregoing, an explanation has been given to the details of the processing in the encoding processing section. In cases where the width of a band in which the frequency component such as a sine wave of a signal to be processed exists is narrow, by using the above processing scheme, it is possible to replace parameters from a psychoacoustic model generated based on the human auditory characteristics with those by which the signal can be effectively quantized, thereby preventing deterioration in the objective characteristics of the signal.

Embodiment 6

Figure 8:
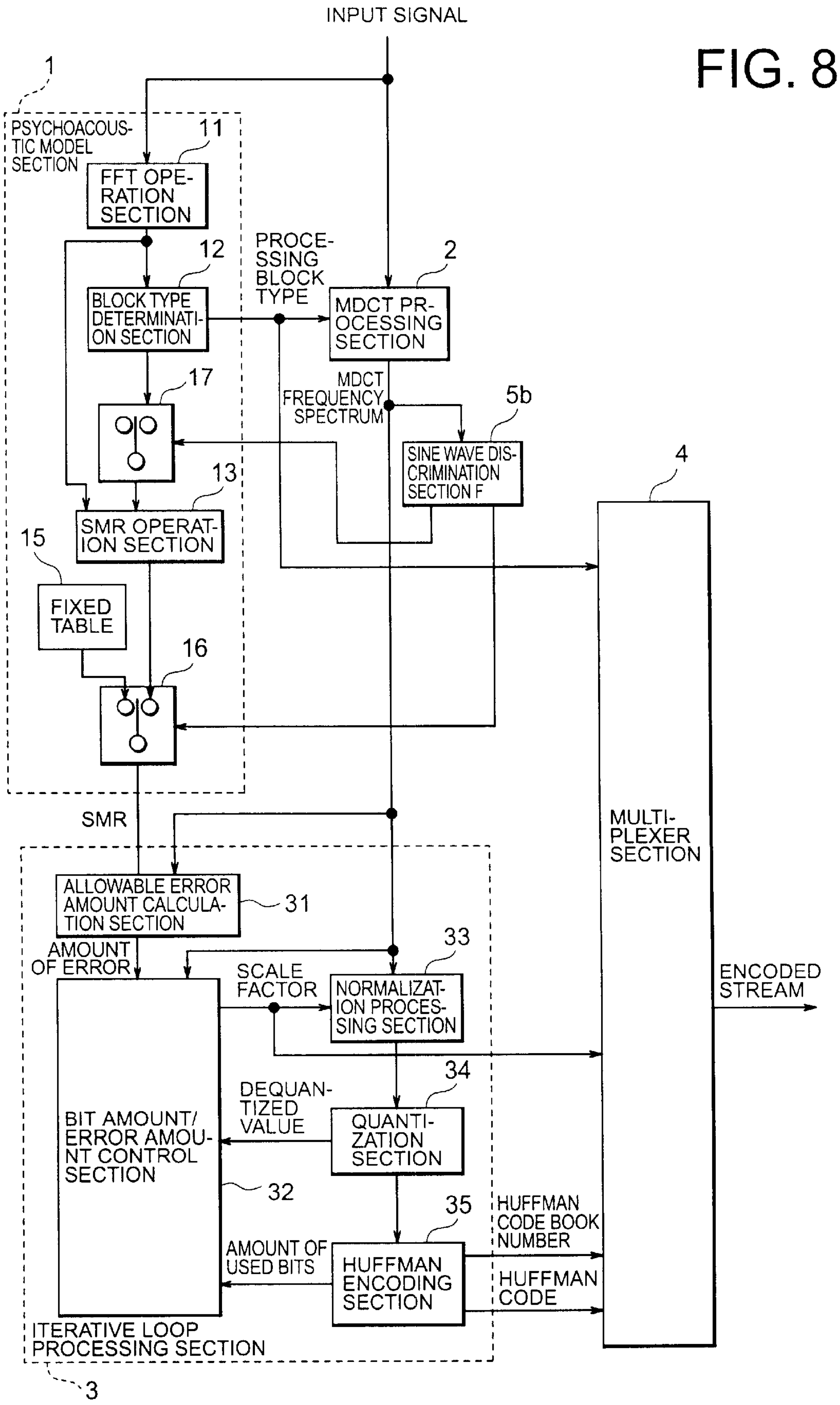
FIG. 8 is a block diagram illustrating an audio signal encoding apparatus according to a sixth embodiment of the present invention.

FIG. 8 illustrates a block diagram of an audio signal encoding apparatus according to a sixth embodiment of the present invention. The same or corresponding parts of this embodiment as those of the above-mentioned embodiments will be identified by the same symbols. In FIG. 8, reference symbol **5*b* designates a sine wave discrimination section F; reference numeral 15 designates a fixed table; and reference numerals 16 and 17** designate switches.

Now, reference will be made to the operation of this sixth embodiment.

An input signal input to the psychoacoustic model section 1 is subjected to the FFT operation processing in the FFT operation section 11 to generate an FFT frequency spectrum.

The block type determination section 12 calculates a masking threshold from the FFT frequency spectrum from the FFT operation section 11, determines the block type of the input signal based on the masking threshold, and supplies the result to the MDCT processing section 2 and the multiplexer section 4 as a processing block type.

Subsequently, the MDCT processing section 2 carries out frequency orthogonal transformation processing based on the processing block type received from the block type determination section 12, and supplies an MDCT frequency spectrum generated as a result of such processing to the allowable error amount calculation section 31 and the normalization processing section 33 in the iterative loop processing section 3 and the sine wave discrimination section F **5*b***.

Using the MDCT frequency spectrum from the MDCT processing section 2, the sine wave discrimination section F **5*b* makes a discrimination as to whether or not a signal component of the input signal is a sine wave. When it is discriminated that the signal component of the input signal is a sine wave, the switch 17 is switched into connection with the non-connected side, thereby stopping the processing in the SMR operation section 13, and the switch 16 is switched into connection with the fixed table 15**, which stores in advance SMRs of preset fixed values.

On the other hand, when it is discriminated that the signal component of the input signal is not a sine wave, the switch 17 is switched into connection with the block type determination section 12, and the switch 16 is switched into connection with the SMR operation section 13. The method of discriminating the sine wave has already been described in detail in the aforementioned fifth embodiment, and hence a description thereof is omitted here.

The SMR operation section 13 calculates an SMR based on the FFT frequency spectrum from the FFT operation section 11 and the masking threshold in the block type determination section 12, and supplies the resultant SMR thus generated to the switch 16.

The operations in the iterative loop processing section 3 are basically the same as those in the above-mentioned embodiments. The processing in the iterative loop processing section 3, which is constituted by the allowable error amount calculation section 31, the bit amount/error amount control section 32, the normalization processing section 33, the quantization section 34 and the Huffman encoding section 35, is reiterated until when the quantized MDCT frequency spectrum actually falls below the allowable amount of error, and when the amount of bits required for quantization actually falls below the allowable amount of bits.

Thereafter, the quantized and Huffman-encoded MDCT frequency spectrum together with ancillary information such as a header, the processing block type determined by the block type determination section 12, the scale factor selected by the bit amount/error amount control section 32 and the Huffman code book number selected by the Huffman encoding section 35 is subjected to the multiplex processing in the multiplexer section 4, so that it is transformed into a coded stream and then sent out to a transmission line.

In the foregoing, an explanation has been given to the details of the processing in the encoding processing section. In cases where the width of a band in which the frequency component such as a sine wave of a signal to be processed exists is narrow, by using the above processing scheme, it is possible to replace parameters from a psychoacoustic model generated based on the human auditory characteristics with those by which the signal can be effectively quantized, thereby preventing deterioration in the objective characteristics of the signal. Additionally, the processing of calculating the SMR can be omitted, thus providing an effect of reducing the amount of processing.

Embodiment 7

Figure 9:
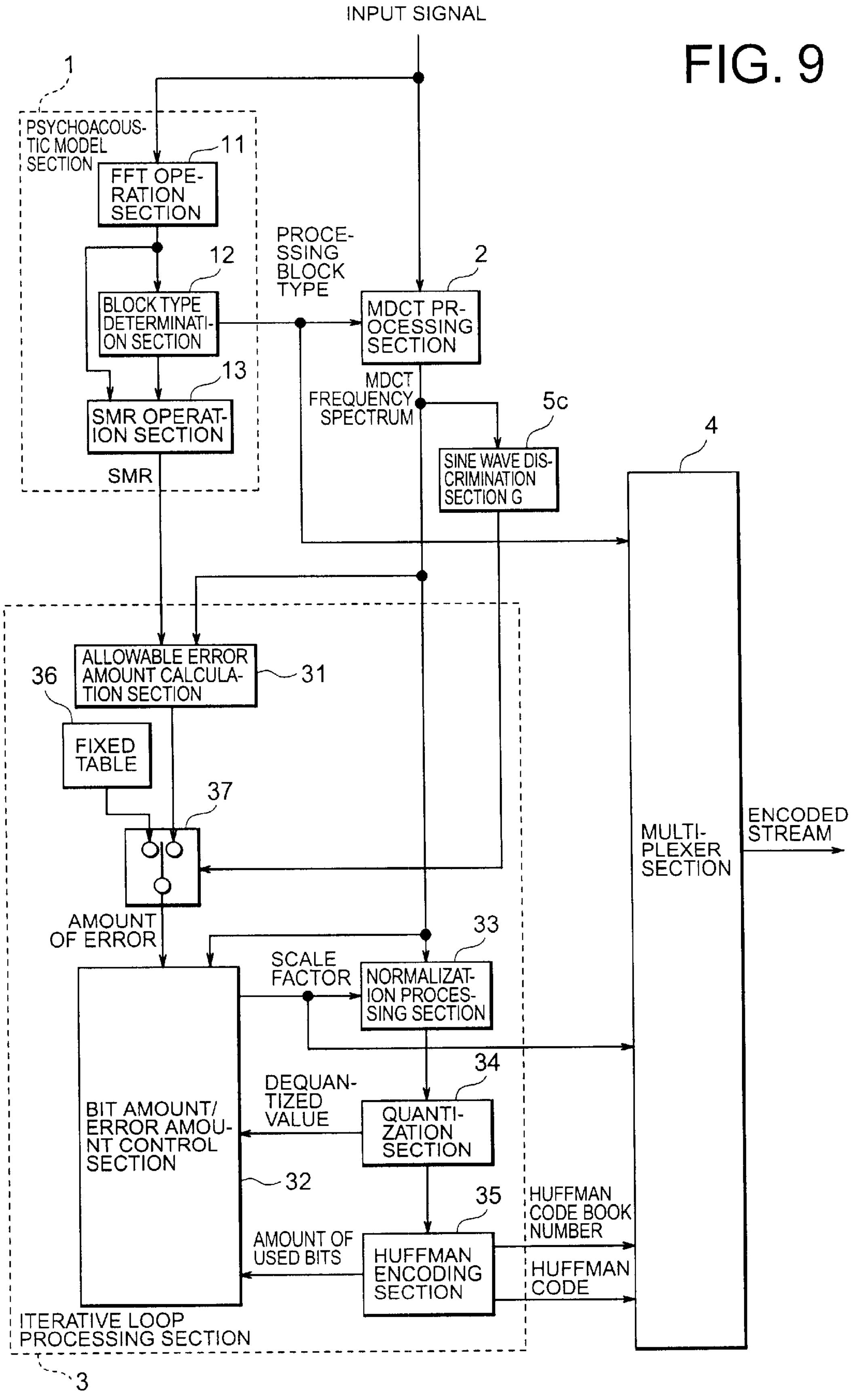
FIG. 9 is a block diagram illustrating an audio signal encoding apparatus according to a seventh embodiment of the present invention.

FIG. 9 illustrates a block diagram of an audio signal encoding apparatus according to a seventh embodiment of the present invention. The same or corresponding parts of this embodiment as those of the above-mentioned embodiments will be identified by the same symbols. In FIG. 9, reference symbol 5*c* designates a sine wave discrimination section G; reference numeral 36 designates a fixed table; and reference numeral 37 designates a switch.

Now, reference will be made to the operation of this seventh embodiment.

The operations of the FFT operation section 11, the block type determination section 12 and the SMR operation section 13 in the psychoacoustic model section 1 are the same as those of the abovementioned embodiments.

The MDCT processing section 2 carries out frequency orthogonal transformation processing based on a processing block type received from the block type determination section 12, and supplies an MDCT frequency spectrum generated as a result of such processing to the allowable error amount calculation section 31 and the normalization processing section 33 in the iterative loop processing section 3 and the sine wave discrimination section G 5*c*.

Using the MDCT frequency spectrum from the MDCT processing section 2, the sine wave discrimination section G 5*c* makes a discrimination as to whether or not a signal component of the input signal is a sine wave, and when it is discriminated that the signal component of the input signal is a sine wave, the switch 37 is switched into connection with the fixed table 36, which stores in advance allowable amounts of error of preset fixed values.

On the other hand, when it is discriminated that the signal component of the input signal is not a sine wave, the switch 37 is switched into connection with the allowable error amount calculation section 31. The method of discriminating the sine wave has already been described in detail in the aforementioned fifth embodiment, and hence a description thereof is omitted here.

The allowable error amount calculation section 31 in the iterative loop processing section 3 carries out multiplication between the MDCT frequency spectrum and the reciprocal (1/SMR) of SMR so as to calculate an allowable amount of error. Note that the amount of error as referred to herein represents a difference between the MDCT frequency spectrum from the MDCT processing section 2 and the dequantized value generated through quantization/dequantization, i.e., a quantizing error, and as long as this value remains within an allowable range, noise can not be perceived by the human ear.

The amount of error calculated in the allowable error amount calculation section 31 is passed to the bit amount/error amount control section 32, where it is used as an index of determination as to whether the MDCT frequency spectrum generated through quantization/dequantization satisfies the allowable amount of error.

The normalization processing section 33 performs the normalization of the MDCT frequency spectrum passed from the MDCT processing section 2 by using a scale factor selected in the bit amount/error amount control section 32.

The quantization section 34 performs the quantization of the MDCT frequency spectrum normalized in the normalization processing section 33, and passes the result of quantization to the Huffman encoding section 35. In addition, the quantization section 34 also performs the dequantization of the quantized MDCT frequency spectrum and passes the result of dequantization to the bit amount/error amount control section 32 in order to calculate an amount of error in the quantization.

The Huffman encoding section 35 performs the Huffman encoding of the quantized MDCT frequency spectrum, and passes an amount of bits actually needed to the bit amount/error amount control section 32, and a Huffman code book number as well as a Huffman code to the multiplexer section 4.

The bit amount/error amount control section 32 calculates a difference between the MDCT frequency spectrum from the MDCT processing section 2 and the dequantized MDCT frequency spectrum obtained from the quantization section 34, i.e., an amount of error due to the quantization, and compares it with the allowable amount of error calculated in the allowable error amount calculation section 31. As a result, when it is determined that the amount of error due to the quantization is greater than the allowable amount of error, the value of the scale factor is reduced and then passed to the normalization processing section 33.

On the other hand, when it is determined that the amount of error due to the quantization is smaller than the allowable amount of error, a comparison is made between the amount of used bits obtained from the Huffman encoding section 35 and the allowable amount of bits calculated from the bit rate specified upon encoding. As a result, when it is determined that the amount of used bits is greater than the allowable amount of bits, the value of the scale factor is increased and then passed to the normalization processing section 33. On the other hand, when it is determined that the amount of used bits is smaller than the allowable amount of bits, the processing in the iterative loop processing section 3 is ended, and the control process is shifted to the multiplex processing.

As described in the foregoing, the processing in the iterative loop processing section 3, which is constituted by the allowable error amount calculation section 31, the bit amount/error amount control section 32, the normalization processing section 33, the quantization section 34 and the Huffman encoding section 35, is reiterated until when the quantized MDCT frequency spectrum actually falls below the allowable amount of error, and when the amount of bits required for quantization actually falls below the allowable amount of bits.

Thereafter, the quantized and Huffman-encoded MDCT frequency spectrum together with ancillary information such as a header, the processing block type determined by the block type determination section 12, the scale factor selected by the bit amount/error amount control section 32 and the Huffman code book number selected by the Huffman encoding section 35 is subjected to the multiplex processing in the multiplexer section 4, so that it is transformed into a coded stream and then sent out to a transmission line.

In the foregoing, an explanation has been given to the details of the processing in the encoding processing section. In cases where the width of a band in which the frequency component such as a sine wave of a signal to be processed exists is narrow, by using the above processing scheme, it is possible to replace parameters from a psychoacoustic model generated based on the human auditory characteristics with those by which the signal can be effectively quantized, thereby preventing deterioration in the objective characteristics of the signal. Additionally, the processing of calculating the allowable amount of error can be omitted, thus providing an effect of reducing the amount of processing.

Embodiment 8

Figure 10:
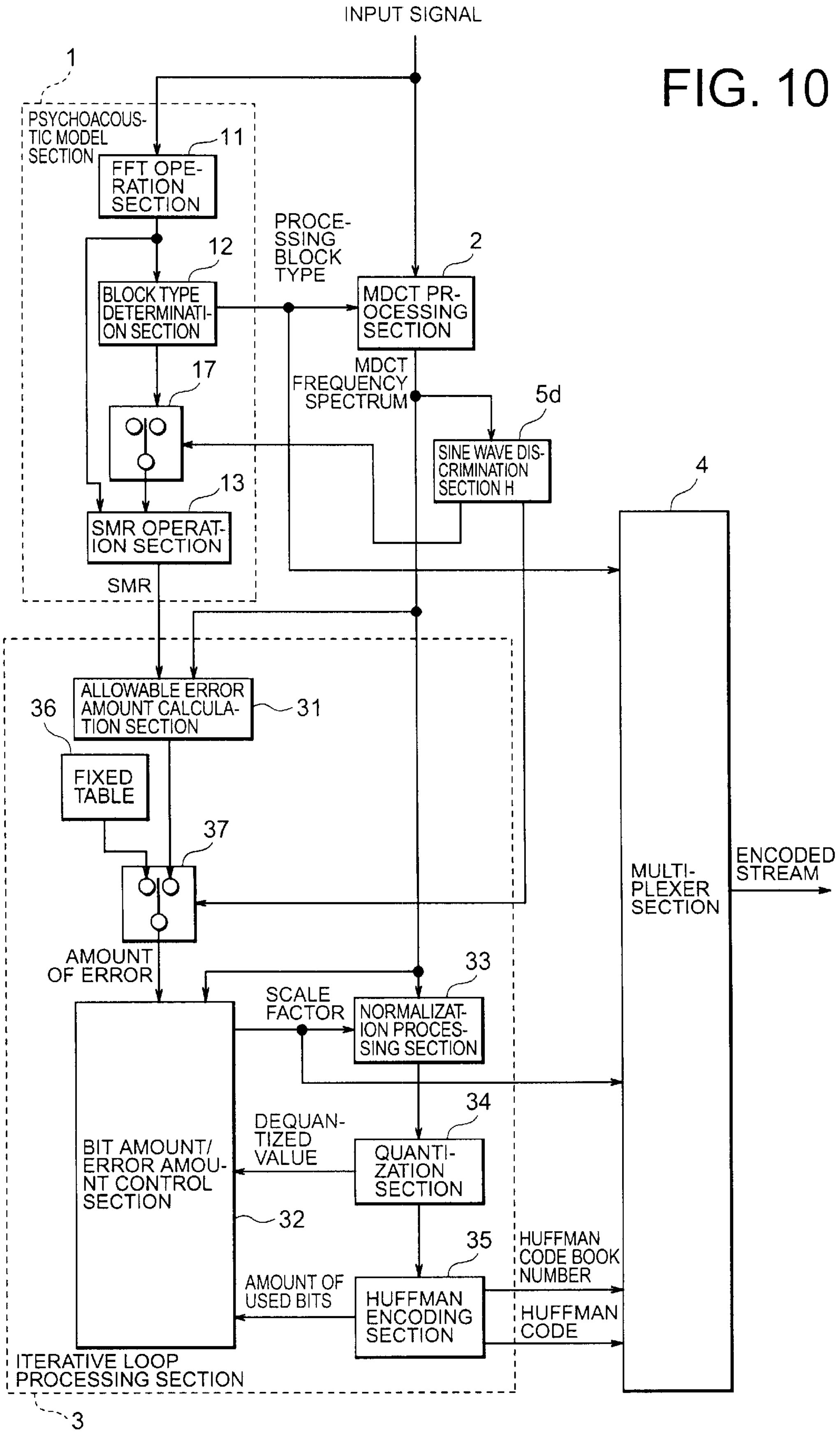
FIG. 10 is a block diagram illustrating an audio signal encoding apparatus according to an eighth embodiment of the present invention.

FIG. 10 illustrates a block diagram of an audio signal encoding apparatus according to an eighth embodiment of the present invention. The same or corresponding parts of this embodiment as those of the above-mentioned embodiments will be identified by the same symbols. In FIG. 10, reference symbol **5*d* designates a sine wave discrimination section H; reference numerals 17 and 37 designate switches; and reference numeral 36** designate a fixed table.

Now, reference will be made to the operation of this eighth embodiment.

An input signal input to the psychoacoustic model section 1 is subjected to the FFT operation processing in the FFT operation section 11 to generate an FFT frequency spectrum.

The block type determination section 12 calculates a masking threshold from the FFT frequency spectrum from the FFT operation section 11, determines the block type of the input signal based on the masking threshold, and supplies the result to the MDCT processing section 2 and the multiplexer section 4 as a processing block type.

Subsequently, the MDCT processing section 2 carries out frequency orthogonal transformation processing based on the processing block type received from the block type determination section 12, and supplies an MDCT frequency spectrum generated as a result of such processing to the allowable error amount calculation section 31 and the normalization processing section 33 in the iterative loop processing section 3 and the sine wave discrimination section H **5*d***.

Using the MDCT frequency spectrum from the MDCT processing section 2, the sine wave discrimination section H **5*d* makes a discrimination as to whether or not a signal component of the input signal is a sine wave. When it is discriminated that the signal component of the input signal is a sine wave, the switch 17 is switched into connection with the non-connected side, thereby stopping the processing in the SMR operation section 13, and the switch 37 is switched into connection with the fixed table 36**, which stores in advance allowable amounts of error of preset fixed values.

On the other hand, when it is discriminated that the signal component of the input signal is not a sine wave, the switch 17 is switched into connection with the block type determination section 12, and the switch 37 is switched into connection with the allowable error amount calculation section 31. The method of discriminating the sine wave has already been described in detail in the aforementioned fifth embodiment, and hence a description thereof is omitted here.

The SMR operation section 13 calculates an SMR based on the FFT frequency spectrum from the FFT operation section 11 and the masking threshold in the block type determination section 12, and supplies the resultant SMR thus generated to the allowable error amount calculation section 31.

The allowable error amount calculation section 31 in the iterative loop processing section 3 carries out multiplication between the MDCT frequency spectrum and the reciprocal (1/SMR) of SMR so as to calculate an allowable amount of error. Note that the amount of error as referred to herein represents a difference between the MDCT frequency spectrum from the MDCT processing section 2 and the dequantized value generated through quantization/dequantization, i.e., a quantizing error, and as long as this value remains within an allowable range, noise can not be perceived by the human ear.

The amount of error calculated in the allowable error amount calculation section 31 is passed to the bit amount/error amount control section 32, where it is used as an index of determination as to whether the MDCT frequency spectrum generated through quantization/dequantization satisfies the allowable amount of error.

The normalization processing section 33 performs the normalization of the MDCT frequency spectrum passed from the MDCT processing section 2 by using a scale factor selected in the bit amount/error amount control section 32.

The quantization section 34 performs the quantization of the MDCT frequency spectrum normalized in the normalization processing section 33, and passes the result of quantization to the Huffman encoding section 35. In addition, the quantization section 34 also performs the dequantization of the quantized MDCT frequency spectrum and passes the result of dequantization to the bit amount/error amount control section 32 in order to calculate an amount of error in the quantization.

The Huffman encoding section 35 performs the Huffman encoding of the quantized MDCT frequency spectrum, and passes an amount of bits actually needed to the bit amount/error amount control section 32, and a Huffman code book number as well as a Huffman code to the multiplexer section 4.

The bit amount/error amount control section 32 calculates a difference between the MDCT frequency spectrum from the MDCT processing section 2 and the dequantized MDCT frequency spectrum obtained from the quantization section 34, i.e., an amount of error due to the quantization, and compares it with the allowable amount of error calculated in the allowable error amount calculation section 31. As a result, when it is determined that the amount of error due to the quantization is greater than the allowable amount of error, the value of the scale factor is reduced and then passed to the normalization processing section 33.

On the other hand, when it is determined that the amount of error due to the quantization is smaller than the allowable amount of error, a comparison is made between the amount of used bits obtained from the Huffman encoding section 35 and the allowable amount of bits calculated from the bit rate specified upon encoding. As a result, when it is determined that the amount of used bits is greater than the allowable amount of bits, the value of the scale factor is increased and then passed to the normalization processing section 33. On the other hand, when it is determined that the amount of used bits is smaller than the allowable amount of bits, the processing in the iterative loop processing section 3 is ended, and the control process is shifted to the multiplex processing.

As described in the foregoing, the processing in the iterative loop processing section 3, which is constituted by the allowable error amount calculation section 31, the bit amount/error amount control section 32, the normalization processing section 33, the quantization section 34 and the Huffman encoding section 35, is reiterated until when the quantized MDCT frequency spectrum actually falls below the allowable amount of error, and when the amount of bits required for quantization actually falls below the allowable amount of bits.

Thereafter, the quantized and Huffman-encoded MDCT frequency spectrum, together with ancillary information such as a header, the processing block type determined by the block type determination section 12, the scale factor selected by the bit amount/error amount control section 32 and the Huffman code book number selected by the Huffman encoding section 35, is subjected to the multiplex processing in the multiplexer section 4, so that it is transformed into a coded stream and then sent out to a transmission line.

In the foregoing, an explanation has been given to the details of the processing in the encoding processing section. In cases where the width of a band in which the frequency component such as a sine wave of a signal to be processed exists is narrow, by using the above processing scheme, it is possible to replace parameters from a psychoacoustic model generated based on the human auditory characteristics with those by which the signal can be effectively quantized, thereby preventing deterioration in the objective characteristics of the signal. Additionally, the processing of calculating the SMR and the allowable amount of error can be omitted, thus providing an effect of reducing the amount of processing.

Embodiment 9

Figure 11:
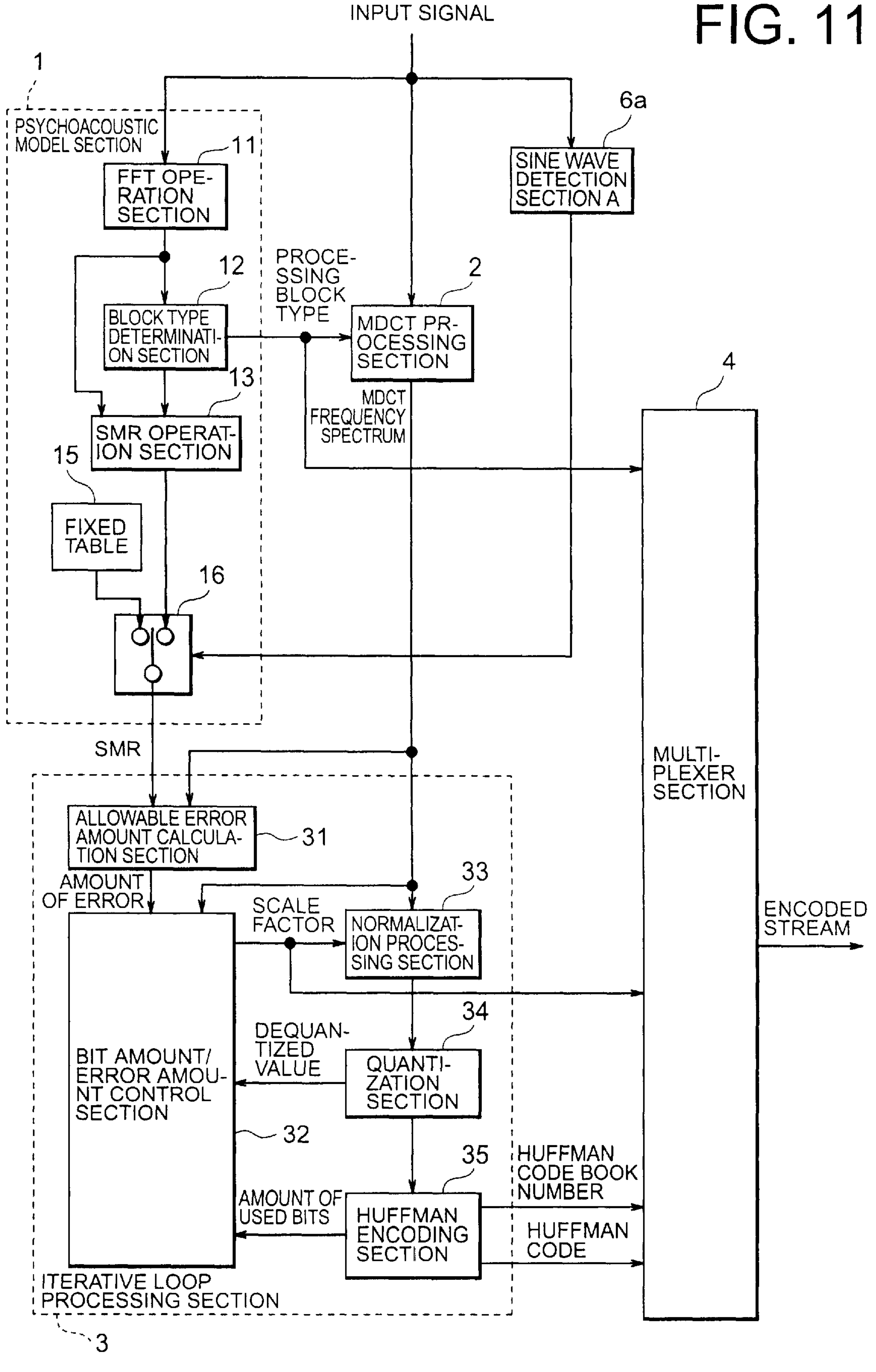
FIG. 11 is a block diagram illustrating an audio signal encoding apparatus according to a ninth embodiment of the present invention.

FIG. 11 illustrates a block diagram of an audio signal encoding apparatus according to a ninth embodiment of the present invention. The same or corresponding parts of this embodiment as those of the above-mentioned embodiments will be identified by the same symbols. In FIG. 11, reference symbol 6*a* designates a sine wave detection section A; reference numeral 15 designates a fixed table; and reference numeral 16 designates a switch.

Now, reference will be made to the operation of this ninth embodiment.

In the aforementioned first through fourth embodiments, the discrimination of a sine wave is made by using the FFT frequency spectrum which is calculated by the FFT operation section 11, and in the aforementioned fifth through eighth embodiments, the discrimination of a sine wave is made by using the MDCT frequency spectrum calculated by the MDCT processing section 2, but in the ninth through twelfth embodiments to be described later, such a discrimination is made by using an input signal to the audio signal encoding apparatus.

An input signal input to the psychoacoustic model section 1 is subjected to the FFT operation processing in the FFT operation section 11 to generate an FFT frequency spectrum.

The block type determination section 12 calculates a masking threshold from the FFT frequency spectrum from the FFT operation section 11, determines the block type of the input signal based on the masking threshold, and supplies the result to the MDCT processing section 2 and the multiplexer section 4 as a processing block type.

The SMR operation section 13 calculates an SMR based on the FFT frequency spectrum from the FFT operation section 11 and the masking threshold in the block type determination section 12, and supplies the resultant SMR thus generated to the switch 16.

Subsequently, the MDCT processing section 2 carries out frequency orthogonal transformation processing based on the processing block type received from the block type determination section 12, and supplies an MDCT frequency spectrum generated as a result of such processing to the allowable error amount calculation section 31 and the normalization processing section 33 in the iterative loop processing section 3.

Using the input signal, the sine wave detection section A 6*a* makes a discrimination as to whether or not a signal component of the input signal is a sine wave, and when it is discriminated that the signal component of the input signal is a sine wave, the switch 16 is switched into connection with the fixed table 15, which stores in advance SMRs of preset fixed values.

On the other hand, when it is discriminated that the signal component of the input signal is not a sine wave, the switch 16 is switched into connection with the SMR operation section 13.

The allowable error amount calculation section 31 in the iterative loop processing section 3 carries out multiplication between the MDCT frequency spectrum and the reciprocal (1/SMR) of SMR so as to calculate an allowable amount of error. Note that the amount of error as referred to herein represents a difference between the MDCT frequency spectrum from the MDCT processing section 2 and the dequantized value generated through quantization/dequantization, i.e., a quantizing error, and as long as this value remains within an allowable range, noise can not be perceived by the human ear.

The amount of error calculated in the allowable error amount calculation section 31 is passed to the bit amount/error amount control section 32, where it is used as an index of determination as to whether the MDCT frequency spectrum generated through quantization/dequantization satisfies the allowable amount of error.

The normalization processing section 33 performs the normalization of the MDCT frequency spectrum passed from the MDCT processing section 2 by using a scale factor selected in the bit amount/error amount control section 32.

The quantization section 34 performs the quantization of the MDCT frequency spectrum normalized in the normalization processing section 33, and passes the result of quantization to the Huffman encoding section 35. In addition, the quantization section 34 also performs the dequantization of the quantized MDCT frequency spectrum and passes the result of dequantization to the bit amount/error amount control section 32 in order to calculate an amount of error in the quantization.

The Huffman encoding section 35 performs the Huffman encoding of the quantized MDCT frequency spectrum, and passes an amount of bits actually needed to the bit amount/error amount control section 32, and a Huffman code book number as well as a Huffman code to the multiplexer section 4.

The bit amount/error amount control section 32 calculates a difference between the MDCT frequency spectrum from the MDCT processing section 2 and the dequantized MDCT frequency spectrum obtained from the quantization section 34, i.e., an amount of error due to the quantization, and compares it with the allowable amount of error calculated in the allowable error amount calculation section 31. As a result, when it is determined that the amount of error due to the quantization is greater than the allowable amount of error, the value of the scale factor is reduced and then passed to the normalization processing section 33.

On the other hand, when it is determined that the amount of error due to the quantization is smaller than the allowable amount of error, a comparison is made between the amount of used bits obtained from the Huffman encoding section 35 and the allowable amount of bits calculated from the bit rate specified upon encoding. As a result, when it is determined that the amount of used bits is greater than the allowable amount of bits, the value of the scale factor is increased and then passed to the normalization processing section 33. On the other hand, when it is determined that the amount of used bits is smaller than the allowable amount of bits, the processing in the iterative loop processing section 3 is ended, and the control process is shifted to the multiplex processing.

As described in the foregoing, the processing in the iterative loop processing section 3, which is constituted by the allowable error amount calculation section 31, the bit amount/error amount control section 32, the normalization processing section 33, the quantization section 34 and the Huffman encoding section 35, is reiterated until when the quantized MDCT frequency spectrum actually falls below the allowable amount of error, and when the amount of bits required for quantization actually falls below the allowable amount of bits.

Thereafter, the quantized and Huffman-encoded MDCT frequency spectrum together with ancillary information such as a header, the processing block type determined by the block type determination section 12, the scale factor selected by the bit amount/error amount control section 32 and the Huffman code book number selected by the Huffman encoding section 35 is subjected to the multiplex processing in the multiplexer section 4, so that it is transformed into a coded stream and then sent out to a transmission line.

In the foregoing, an explanation has been given to the details of the processing in the encoding processing section. In cases where the width of a band in which the frequency component such as a sine wave of a signal to be processed exists is narrow, by using the above processing scheme, it is possible to replace parameters from a psychoacoustic model generated based on the human auditory characteristics with those by which the signal can be effectively quantized, thereby preventing deterioration in the objective characteristics of the signal.

Embodiment 10

Figure 12:
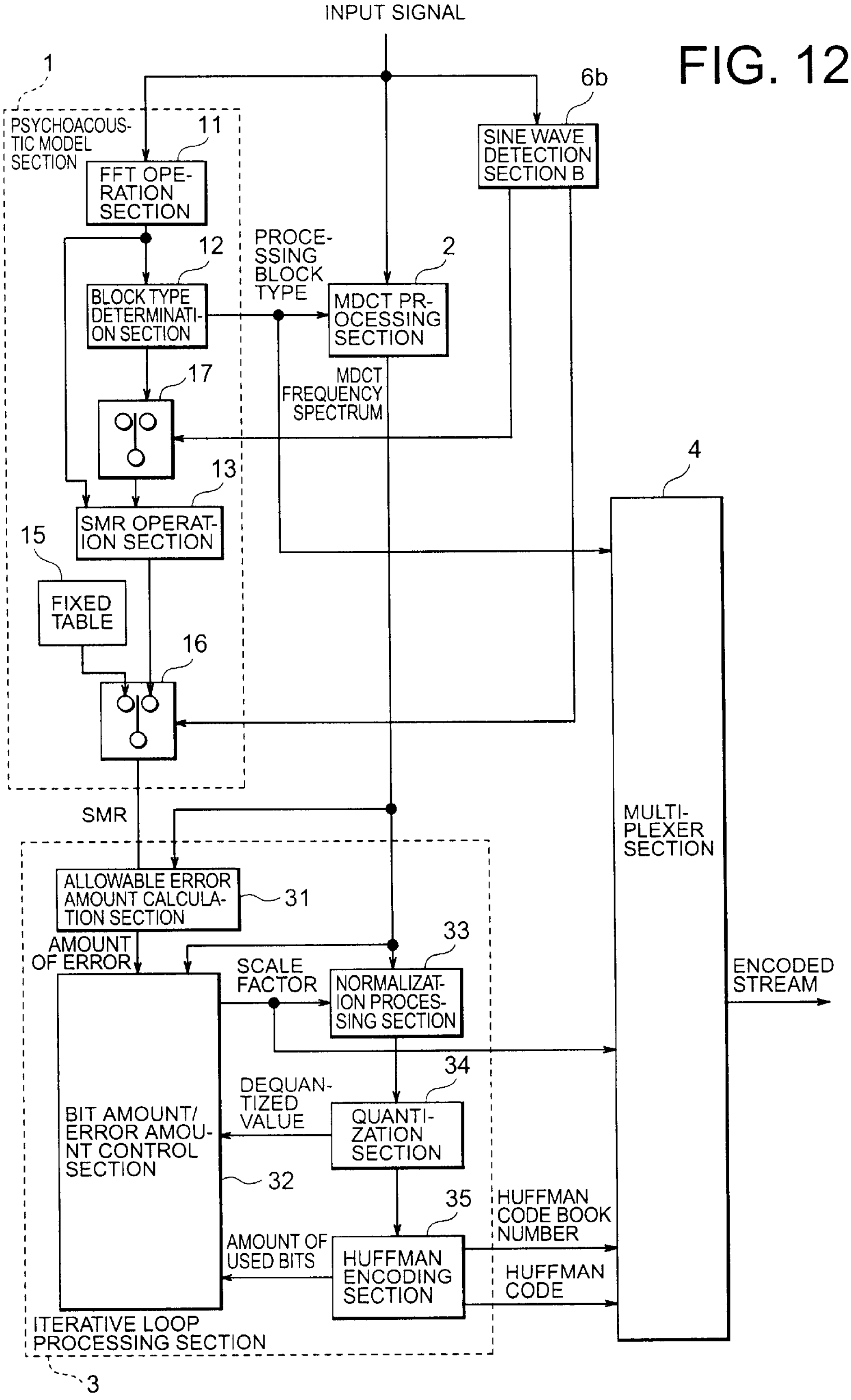
FIG. 12 is a block diagram illustrating an audio signal encoding apparatus according to a tenth embodiment of the present invention.

FIG. 12 illustrates a block diagram of an audio signal encoding apparatus according to a tenth embodiment of the present invention. The same or corresponding parts of this embodiment as those of the above-mentioned first embodiment will be identified by the same symbols. In FIG. 12, reference symbol **6*b* designates a sine wave detection section B; reference numeral 15 designates a fixed table; and reference numerals 16** and 17 designate switches.

Now, reference will be made to the operation of this tenth embodiment.

An input signal input to the psychoacoustic model section 1 is subjected to the FFT operation processing in the FFT operation section 11 to generate an FFT frequency spectrum.

The block type determination section 12 calculates a masking threshold from the FFT frequency spectrum from the FFT operation section 11, determines the block type of the input signal based on the masking threshold, and supplies the result to the MDCT processing section 2 and the multiplexer section 4 as a processing block type.

Subsequently, the MDCT processing section 2 carries out frequency orthogonal transformation processing based on the processing block type received from the block type determination section 12, and supplies an MDCT frequency spectrum generated as a result of such processing to the allowable error amount calculation section 31 and the normalization processing section 33 in the iterative loop processing section 3.

Using the input signal, the sine wave detection section B **6*b* makes a discrimination as to whether or not a signal component of the input signal is a sine wave. When it is discriminated that the signal component of the input signal is a sine wave, the switch 17 is switched into connection with the non-connected side, thereby stopping the processing in the SMR operation section 13, and the switch 16 is switched into connection with the fixed table 15**, which stores in advance SMRs of preset fixed values.

On the other hand, when it is discriminated that the signal component of the input signal is not a sine wave, the switch 17 is switched into connection with the block type determination section 12, and the switch 16 is switched into connection with the SMR operation section 13.

The SMR operation section 13 calculates an SMR based on the FFT frequency spectrum from the FFT operation section 11 and the masking threshold in the block type determination section 12, and supplies the resultant SMR thus generated to the switch 16.

The operations in the iterative loop processing section 3 are basically the same as those in the above-mentioned embodiments. The processing in the iterative loop processing section 3, which is constituted by the allowable error amount calculation section 31, the bit amount/error amount control section 32, the normalization processing section 33, the quantization section 34 and the Huffman encoding section 35, is reiterated until when the quantized MDCT frequency spectrum actually falls below the allowable amount of error, and when the amount of bits required for quantization actually falls below the allowable amount of bits.

Thereafter, the quantized and Huffman-encoded MDCT frequency spectrum together with ancillary information such as a header, the processing block type determined by the block type determination section 12, the scale factor selected by the bit amount/error amount control section 32 and the Huffman code book number selected by the Huffman encoding section 35 is subjected to the multiplex processing in the multiplexer section 4, so that it is transformed into a coded stream and then sent out to a transmission line.

In the foregoing, an explanation has been given to the details of the processing in the encoding processing section. In cases where the width of a band in which the frequency component such as a sine wave of a signal to be processed exists is narrow, by using the above processing scheme, it is possible to replace parameters from a psychoacoustic model generated based on the human auditory characteristics with those by which the signal can be effectively quantized, thereby preventing deterioration in the objective characteristics of the signal. Additionally, the processing of calculating the SMR can be omitted, thus providing an effect of reducing the amount of processing.

Embodiment 11

Figure 13:
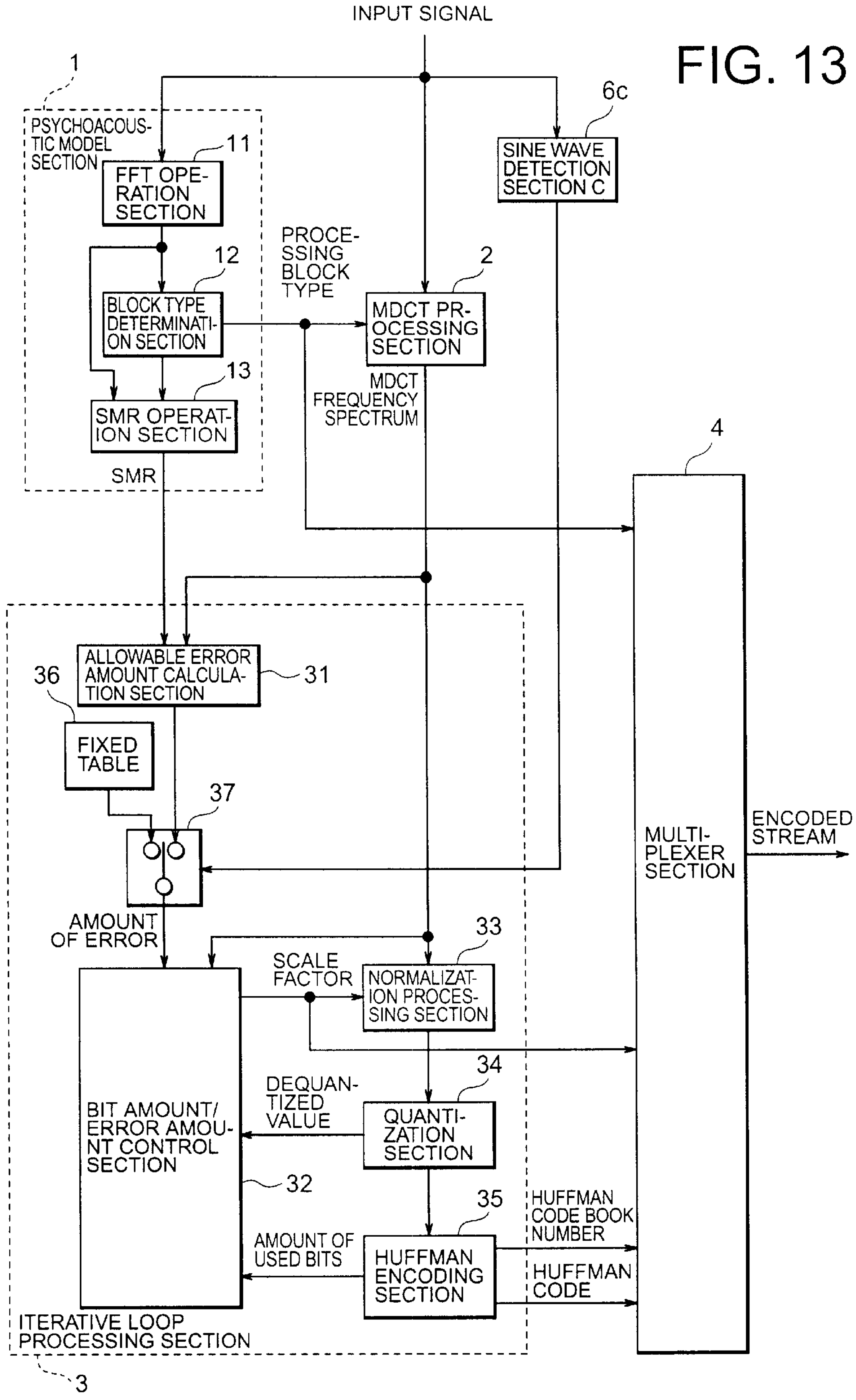
FIG. 13 is a block diagram illustrating an audio signal encoding apparatus according to an eleventh embodiment of the present invention.

FIG. 13 illustrates a block diagram of an audio signal encoding apparatus according to an eleventh embodiment of the present invention. The same or corresponding parts of this embodiment as those of the above-mentioned embodiments will be identified by the same symbols. In FIG. 13, reference symbol 6*c* designates a sine wave detection section C; reference numeral 36 designates a fixed table; and reference numeral 37 designates a switch.

Now, reference will be made to the operation of this eleventh embodiment.

The operations of the FFT operation section 11, the block type determination section 12 and the SMR operation section 13 in the psychoacoustic model section 1 are the same as those of the above-mentioned embodiments.

The MDCT processing section 2 carries out frequency orthogonal transformation processing based on a processing block type received from the block type determination section 12, and supplies an MDCT frequency spectrum generated as a result of such processing to the allowable error amount calculation section 31 and the normalization processing section 33 in the iterative loop processing section 3.

Using the input signal, the sine wave detection section C 6*c* makes a discrimination as to whether or not a signal component of the input signal is a sine wave, and when it is discriminated that the signal component of the input signal is a sine wave, the switch 37 is switched into connection with the fixed table 36, which stores in advance allowable amounts of error of preset fixed values.

On the other hand, when it is discriminated that the signal component of the input signal is not a sine wave, the switch 37 is switched into connection with the allowable error amount calculation section 31.

The allowable error amount calculation section 31 in the iterative loop processing section 3 carries out multiplication between the MDCT frequency spectrum and the reciprocal (1/SMR) of SMR so as to calculate an allowable amount of error. Note that the amount of error as referred to herein represents a difference between the MDCT frequency spectrum from the MDCT processing section 2 and the dequantized value generated through quantization/dequantization, i.e., a quantizing error, and as long as this value remains within an allowable range, noise can not be perceived by the human ear.

The amount of error calculated in the allowable error amount calculation section 31 is passed to the bit amount/error amount control section 32, where it is used as an index of determination as to whether the MDCT frequency spectrum generated through quantization/dequantization satisfies the allowable amount of error.

The normalization processing section 33 performs the normalization of the MDCT frequency spectrum passed from the MDCT processing section 2 by using a scale factor selected in the bit amount/error amount control section 32.

The quantization section 34 performs the quantization of the MDCT frequency spectrum normalized in the normalization processing section 33, and passes the result of quantization to the Huffman encoding section 35. In addition, the quantization section 34 also performs the dequantization of the quantized MDCT frequency spectrum and passes the result of dequantization to the bit amount/error amount control section 32 in order to calculate an amount of error in the quantization.

The Huffman encoding section 35 performs the Huffman encoding of the quantized MDCT frequency spectrum, and passes an amount of bits actually needed to the bit amount/error amount control section 32, and a Huffman code book number as well as a Huffman code to the multiplexer section 4.

The bit amount/error amount control section 32 calculates a difference between the MDCT frequency spectrum from the MDCT processing section 2 and the dequantized MDCT frequency spectrum obtained from the quantization section 34, i.e., an amount of error due to the quantization, and compares it with the allowable amount of error calculated in the allowable error amount calculation section 31. As a result, when it is determined that the amount of error due to the quantization is greater than the allowable amount of error, the value of the scale factor is reduced and then passed to the normalization processing section 33.

On the other hand, when it is determined that the amount of error due to the quantization is smaller than the allowable amount of error, a comparison is made between the amount of used bits obtained from the Huffman encoding section 35 and the allowable amount of bits calculated from the bit rate specified upon encoding. As a result, when it is determined that the amount of used bits is greater than the allowable amount of bits, the value of the scale factor is increased and then passed to the normalization processing section 33. On the other hand, when it is determined that the amount of used bits is smaller than the allowable amount of bits, the processing in the iterative loop processing section 3 is ended, and the control process is shifted to the multiplex processing.

As described in the foregoing, the processing in the iterative loop processing section 3, which is constituted by the allowable error amount calculation section 31, the bit amount/error amount control section 32, the normalization processing section 33, the quantization section 34 and the Huffman encoding section 35, is reiterated until when the quantized MDCT frequency spectrum actually falls below the allowable amount of error, and when the amount of bits required for quantization actually falls below the allowable amount of bits.

Thereafter, the quantized and Huffman-encoded MDCT frequency spectrum together with ancillary information such as a header, the processing block type determined by the block type determination section 12, the scale factor selected by the bit amount/error amount control section 32 and the Huffman code book number selected by the Huffman encoding section 35 is subjected to the multiplex processing in the multiplexer section 4, so that it is transformed into a coded stream and then sent out to a transmission line.

In the foregoing, an explanation has been given to the details of the processing in the encoding processing section. In cases where the width of a band in which the frequency component such as a sine wave of a signal to be processed exists is narrow, by using the above processing scheme, it is possible to replace parameters from a psychoacoustic model generated based on the human auditory characteristics with those by which the signal can be effectively quantized, thereby preventing deterioration in the objective characteristics of the signal. Additionally, the processing of calculating the allowable amount of error can be omitted, thus providing an effect of reducing the amount of processing.

Embodiment 12

Figure 14:
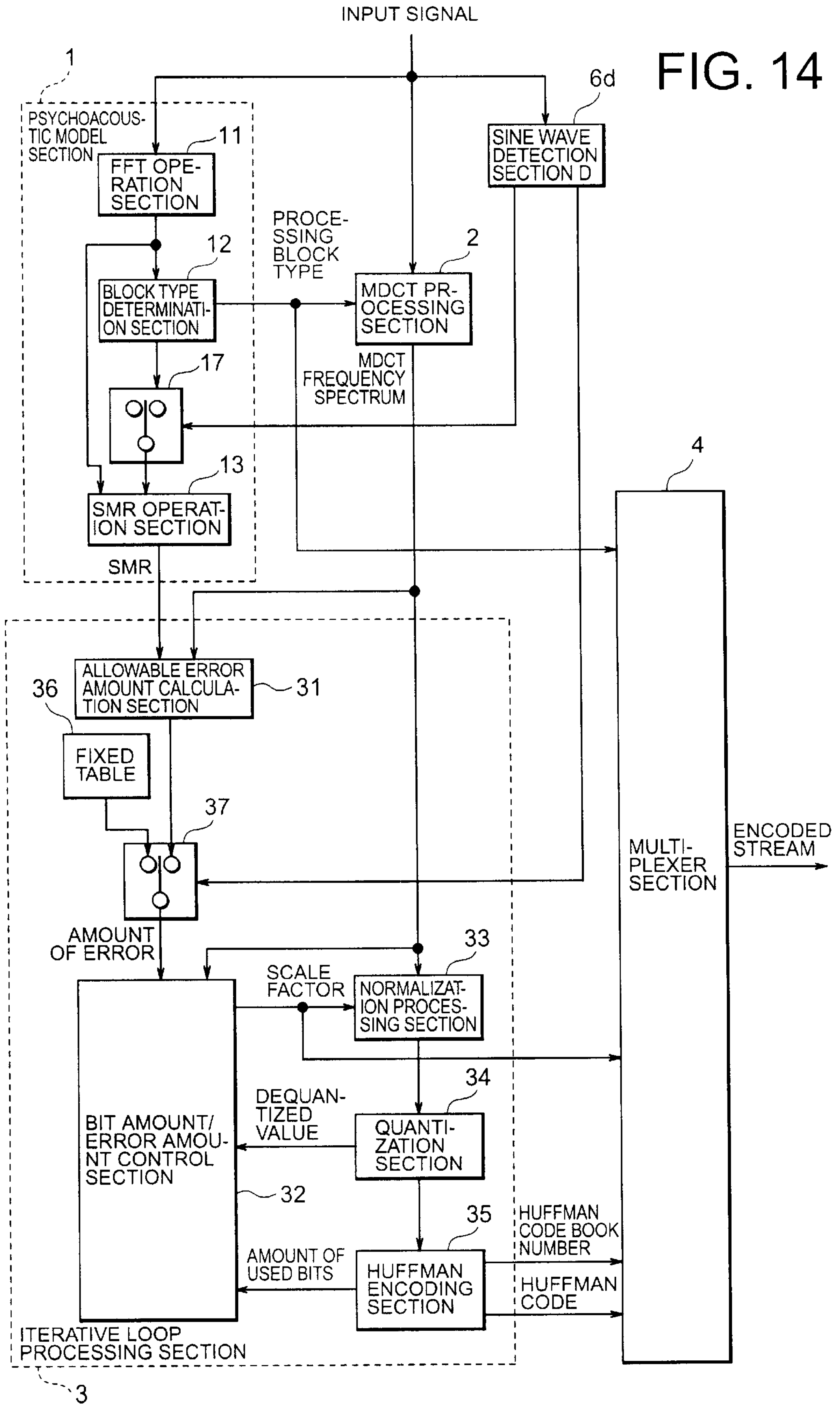
FIG. 14 is a block diagram illustrating an audio signal encoding apparatus according to a twelfth embodiment of the present invention.
Figure 15:
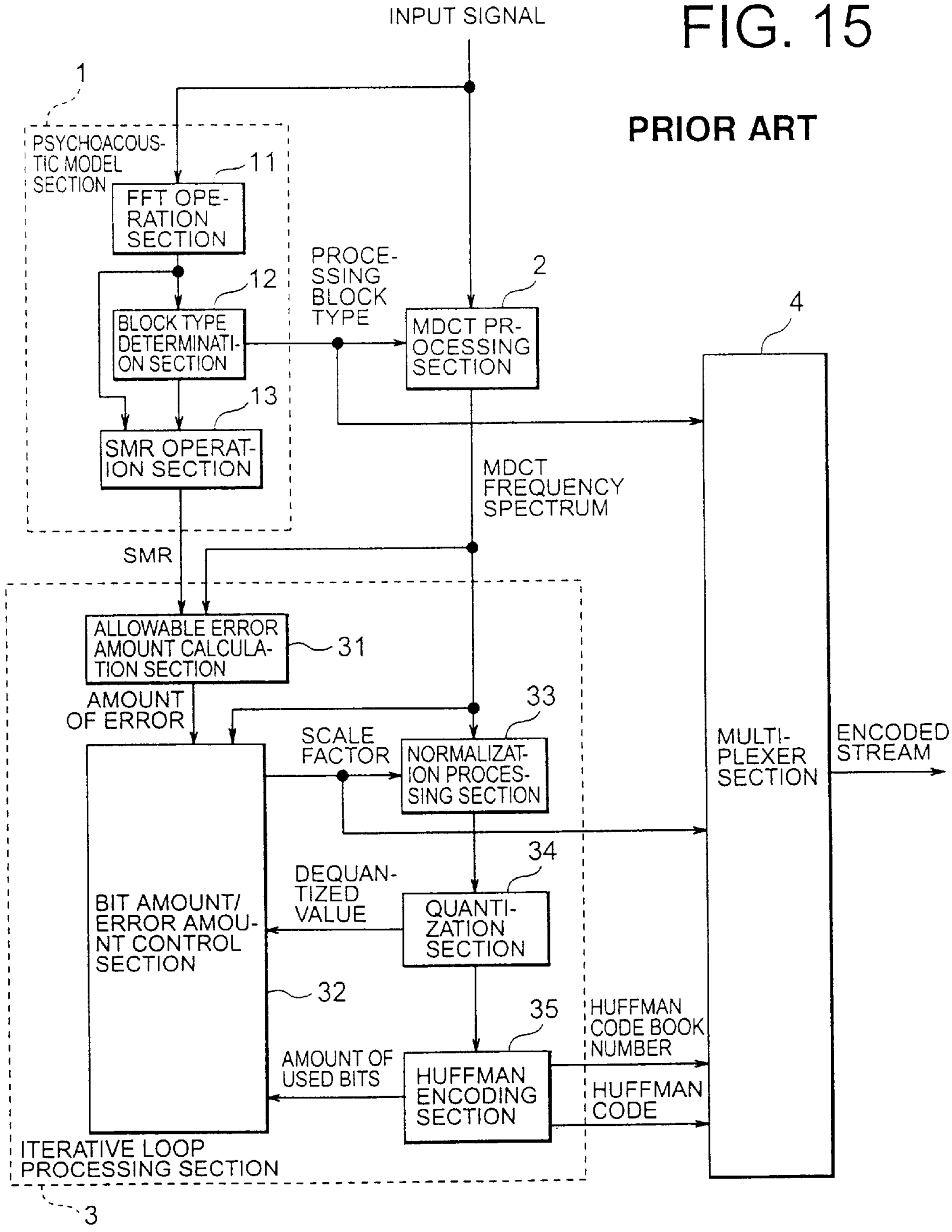
FIG. 15 PRIOR ART
FIG. 15 is a block diagram illustrating a conventional audio signal encoding apparatus.

FIG. 14 illustrates a block diagram of an audio signal encoding apparatus according to a twelfth embodiment of the present invention. The same or corresponding parts of this embodiment as those of the abovementioned embodiments will be identified by the same symbols. In FIG. 14, the audio signal encoding apparatus according to this embodiment comprises: a psychoacoustic model section 1 which includes an FFT operation section 11, a block type determination section 12, an SMR operation section 13 and a switch 17; an MDCT processing section 2; an iterative loop processing section 3 which includes an allowable error amount calculation section 31, a bit amount/error amount control section 32, a normalization processing section 33, a quantization section 34, a Huffman encoding section 35, a fixed table 36 and a switch 37; a multiplexer section 4; and a sine wave detection section D 6*d*.

Now, reference will be made to the operation of this twelfth embodiment.

An input signal input to the psychoacoustic model section 1 is subjected to the FFT operation processing in the FFT operation section 11 to generate an FFT frequency spectrum.

The block type determination section 12 calculates a masking threshold from the FFT frequency spectrum from the FFT operation section 11, determines the block type of the input signal based on the masking threshold, and supplies the result to the MDCT processing section 2 and the multiplexer section 4 as a processing block type.

Subsequently, the MDCT processing section 2 carries out frequency orthogonal transformation processing based on the processing block type received from the block type determination section 12, and supplies an MDCT frequency spectrum generated as a result of such processing to the allowable error amount calculation section 31 and the normalization processing section 33 in the iterative loop processing section 3.

Using the input signal, the sine wave detection section D 6*d* makes a discrimination as to whether or not a signal component of the input signal is a sine wave. When it is discriminated that the signal component of the input signal is a sine wave, the switch 17 is switched into connection with the non-connected side, thereby stopping the processing in the SMR operation section 13, and the switch 37 is switched into connection with the fixed table 36, which stores in advance allowable amounts of error of preset fixed values.

On the other hand, when it is discriminated that the signal component of the input signal is not a sine wave, the switch 17 is switched into connection with the block type determination section 12, and the switch 37 is switched into connection with the allowable error amount calculation section 31.

The SMR operation section 13 calculates an SMR based on the FFT frequency spectrum from the FFT operation section 11 and the masking threshold in the block type determination section 12, and supplies the resultant SMR thus generated to the allowable error amount calculation section 31.

The allowable error amount calculation section 31 in the iterative loop processing section 3 carries out multiplication between the MDCT frequency spectrum and the reciprocal (1/SMR) of SMR so as to calculate an allowable amount of error. Note that the amount of error as referred to herein represents a difference between the MDCT frequency spectrum from the MDCT processing section 2 and the dequantized value generated through quantization/dequantization, i.e., a quantizing error, and as long as this value remains within an allowable range, noise can not be perceived by the human ear.

The amount of error calculated in the allowable error amount calculation section 31 is passed to the bit amount/error amount control section 32, where it is used as an index of determination as to whether the MDCT frequency spectrum generated through quantization/dequantization satisfies the allowable amount of error.

The normalization processing section 33 performs the normalization of the MDCT frequency spectrum passed from the MDCT processing section 2 by using a scale factor selected in the bit amount/error amount control section 32.

The quantization section 34 performs the quantization of the MDCT frequency spectrum normalized in the normalization processing section 33, and passes the result of quantization to the Huffman encoding section 35. In addition, the quantization section 34 also performs the dequantization of the quantized MDCT frequency spectrum and passes the result of dequantization to the bit amount/error amount control section 32 in order to calculate an amount of error in the quantization.

The Huffman encoding section 35 performs the Huffman encoding of the quantized MDCT frequency spectrum, and passes an amount of bits actually needed to the bit amount/error amount control section 32, and a Huffman code book number as well as a Huffman code to the multiplexer section 4.

The bit amount/error amount control section 32 calculates a difference between the MDCT frequency spectrum from the MDCT processing section 2 and the dequantized MDCT frequency spectrum obtained from the quantization section 34, i.e., an amount of error due to the quantization, and compares it with the allowable amount of error calculated in the allowable error amount calculation section 31. As a result, when it is determined that the amount of error due to the quantization is greater than the allowable amount of error, the value of the scale factor is reduced and then passed to the normalization processing section 33.

On the other hand, when it is determined that the amount of error due to the quantization is smaller than the allowable amount of error, a comparison is made between the amount of used bits obtained from the Huffman encoding section 35 and the allowable amount of bits calculated from the bit rate specified upon encoding. As a result, when it is determined that the amount of used bits is greater than the allowable amount of bits, the value of the scale factor is increased and then passed to the normalization processing section 33. On the other hand, when it is determined that the amount of used bits is smaller than the allowable amount of bits, the processing in the iterative loop processing section 3 is ended, and the control process is shifted to the multiplex processing.

As described in the foregoing, the processing in the iterative loop processing section 3, which is constituted by the allowable error amount calculation section 31, the bit amount/error amount control section 32, the normalization processing section 33, the quantization section 34 and the Huffman encoding section 35, is reiterated until when the quantized MDCT frequency spectrum actually falls below the allowable amount of error, and when the amount of bits required for quantization actually falls below the allowable amount of bits.

Thereafter, the quantized and Huffman-encoded MDCT frequency spectrum together with ancillary information such as a header, the processing block type determined by the block type determination section 12, the scale factor selected by the bit amount/error amount control section 32 and the Huffman code book number selected by the Huffman encoding section 35 is subjected to the multiplex processing in the multiplexer section 4, so that it is transformed into a coded stream and then sent out to a transmission line.

In the foregoing, an explanation has been given to the details of the processing in the encoding processing section. In cases where the width of a band in which the frequency component such as a sine wave of a signal to be processed exists is narrow, by using the above processing scheme, it is possible to replace parameters from a psychoacoustic model generated based on the human auditory characteristics with those by which the signal can be effectively quantized, thereby preventing deterioration in the objective characteristics of the signal. Additionally, the processing of calculating the SMR and the processing of calculating the allowable amount of error can be omitted, thus providing an effect of reducing the amount of processing.

As described above, the present invention provides the following advantages.

According to an audio signal encoding apparatus of the present invention, by replacing parameters from a psychoacoustic model generated based on the human auditory characteristics with those by which a signal input to the apparatus can be effectively quantized, it is possible to prevent deterioration in the objective characteristics of the signal.

Moreover, by omitting either one or both of the processing of calculating an SMR and the processing of calculating an allowable amount of error, it is possible to reduce the amount of processing.

In addition, in cases where an output value of either one or both of SMR calculation processing and allowable error amount calculation processing is not utilized, or where either one or both of SMR calculation processing and allowable error amount calculation processing is not performed, it is possible to set a desired value by using a preset SMR value or a preset allowable error amount value.

Further, the above-mentioned invention can be implemented by using an amplitude spectrum as an FFT frequency spectrum.

Furthermore, the above-mentioned invention can be implemented by using a power spectrum as an FFT frequency spectrum.

Still further, the above-mentioned invention can be implemented by using a real number component or an imaginary number component of an FFT operation result as an FFT frequency spectrum.

Further, the above-mentioned invention can be implemented by using a power spectrum as an MDCT frequency spectrum which is used for discrimination of a sine wave in the sine wave discrimination section.

While the invention has been described in terms of preferred embodiments, those skilled in the art will recognize that the invention can be practiced with modifications within the spirit and scope of the appended claims.

What is claimed is:

1. An audio signal encoding apparatus comprising:

an FFT operation section for performing FFT operation processing of an input signal;

a block type determination section for determining a processing block for use in MDCT processing by using an FFT frequency spectrum calculated by said FFT operation section;

a sine wave discrimination section for discriminating whether or not said input signal is a sine wave, by using the FFT frequency spectrum calculated by said FFT operation section;

an SMR operation section for calculating an SMR by using the FFT frequency spectrum calculated by said FFT operation section;

a switching section for switching between use and nonuse of an output value from said SMR operation section based on the result of sine wave discrimination in said sine wave discrimination section;

an MDCT processing section for calculating an MDCT frequency spectrum by performing frequency orthogonal transformation processing of said input signal based on the processing block type received from said block type determination section;

an allowable error amount calculation section for calculating an allowable amount of error by using said SMR and said MDCT frequency spectrum;

a bit amount/error amount control section for determining a scale factor by performing bit amount/error amount control based on an amount of error from said allowable error amount calculation section, a dequantized value from a quantization section and an amount of used bits from a Huffman encoding section;

a normalization processing section for normalizing said MDCT frequency spectrum from said MDCT processing section based on the scale factor from said bit amount/error amount control section;

said quantization section for quantizing and dequantizing said MDCT frequency spectrum normalized by said normalization processing section;

said Huffman encoding section for performing Huffman encoding of said quantized MDCT frequency spectrum to output a Huffman code book number and a Huffman code and to calculate an amount of used bits; and a multiplexer section for multiplexing the processing block type from said block type determination section, the scale factor from said bit amount/error amount control section, the Huffman code book number and the Huffman code from said Huffman encoding section.

2. The audio signal encoding apparatus according to claim 1, further comprising a switching section for switching between execution and stop of the calculation processing of said SMR operation section based on the result of sine wave discrimination in said sine wave discrimination section.

3. The audio signal encoding apparatus according to claim 2, wherein said switching section for switching between use and nonuse of an output value from said SMR operation section based on the result of sine wave discrimination in said sine wave discrimination section uses a preset SMR value when the output value from said SMR operation section is not used.

4. The audio signal encoding apparatus according to claim 1, wherein said switching section for switching between use and nonuse of an output value from said SMR operation section based on the result of sine wave discrimination in said sine wave discrimination section uses a preset SMR value when the output value from said SMR operation section is not used.

5. The audio signal encoding apparatus according to claim 1, wherein said FFT frequency spectrum is an amplitude spectrum.

6. The audio signal encoding apparatus according to claim 1, wherein said FFT frequency spectrum is a power spectrum.

7. The audio signal encoding apparatus according to claim 1, wherein said FFT frequency spectrum is a real number component or an imaginary component of the FFT operation result.

8. An audio signal encoding apparatus comprising:

an FFT operation section for performing FFT operation processing of an input signal;

a block type determination section for determining a processing block type for use in MDCT processing by using an FFT frequency spectrum calculated by said FFT operation section;

a sine wave discrimination section for discriminating whether or not said input signal is a sine wave, by using the FFT frequency spectrum calculated by said FFT operation section;

an SMR operation section for calculating an SMR by using the FFT frequency spectrum calculated by said FFT operation section;

an MDCT processing section for calculating an MDCT frequency spectrum by performing frequency orthogonal transformation processing of said input signal based on the processing block type received from said block type determination section;

an allowable error amount calculation section for calculating an allowable amount of error by using said SMR and said MDCT frequency spectrum;

a switching section for switching between use and nonuse of an output value from said allowable error amount calculation section based on the result of sine wave discrimination in said sine wave discrimination section;

a bit amount/error amount control section for determining a scale factor by performing bit amount/error amount control based on an amount of error from said allowable error amount calculation section, a dequantized value from a quantization section and an amount of used bits from a Huffman encoding section;

a normalization processing section for normalizing said MDCT frequency spectrum from said MDCT processing section based on the scale factor from said bit amount/error amount control section;

said quantization section for quantizing and dequantizing said MDCT frequency spectrum normalized by said normalization processing section;

said Huffman encoding section for performing Huffman encoding of said quantized MDCT frequency spectrum to output a Huffman code book number and a Huffman code and to calculate an amount of used bits; and a multiplexer section for multiplexing the processing block type from said block type determination section, the scale factor from said bit amount/error amount control section, the Huffman code book number and the Huffman code from said Huffman encoding section.

9. The audio signal encoding apparatus according to claim 8, further comprising:

a switching section for switching between execution and stop of the calculation processing of said SMR operation section based on the result of sine wave discrimination in said sine wave discrimination section; and a switching section for switching between execution and stop of the calculation processing of said allowable error amount calculation section based on the result of sine wave discrimination in said sine wave discrimination section.

10. The audio signal encoding apparatus according to claim 9, wherein when the output value from said allowable error amount calculation section is not used, a preset allowable error amount value is used in said switching section for switching between use and nonuse of an output value from said allowable error amount calculation section based on the result of sine wave discrimination in said sine wave discrimination section.

11. The audio signal encoding apparatus according to claim 9, wherein when the calculation processing of said SMR operation section is stopped, a preset SMR value is used in said switching section for switching between execution and stop of the calculation processing of said SMR operation section based on the result of sine wave discrimination in said sine wave discrimination section.

12. The audio signal encoding apparatus according to claim 10, wherein when the calculation processing of said SMR operation section is stopped, a preset SMR value is used in said switching section for switching between execution and stop of the calculation processing of said SMR operation section based on the result of sine wave discrimination in said sine wave discrimination section.

13. The audio signal encoding apparatus according to claim 8, wherein when the output value from said allowable error amount calculation section is not used, a preset allowable error amount value is used in said switching section for switching between use and nonuse of an output value from said allowable error amount calculation section based on the result of sine wave discrimination in said sine wave discrimination section.

14. The audio signal encoding apparatus according to claim 13, wherein when the calculation processing of said SMR operation section is stopped, a preset SMR value is used in said switching section for switching between execution and stop of the calculation processing of said SMR operation section based on the result of sine wave discrimination in said sine wave discrimination section.

15. An audio signal encoding apparatus comprising:

an FFT operation section for performing FFT operation processing of an input signal;

a block type determination section for determining a processing block type for use in MDCT processing by using an FFT frequency spectrum calculated by said FFT operation section;

an MDCT processing section for calculating an MDCT frequency spectrum by performing frequency orthogonal transformation processing of said input signal based on the processing block type received from said block type determination section;

a sine wave discrimination section for discriminating whether or not said input signal is a sine wave, by using the MDCT frequency spectrum calculated by said MDCT processing section;

an SMR operation section for calculating an SMR by using the FFT frequency spectrum calculated by said FFT operation section;

a switching section for switching between use and nonuse of an output value from said SMR operation section based on the result of sine wave discrimination in said sine wave discrimination section;

an allowable error amount calculation section for calculating an allowable amount of error by using said SMR and said MDCT frequency spectrum;

a bit amount/error amount control section for determining a scale factor by performing bit amount/error amount control based on an amount of error from said allowable error amount calculation section, a dequantized value from a quantization section and an amount of used bits from a Huffman encoding section;

a normalization processing section for normalizing said MDCT frequency spectrum from said MDCT processing section based on the scale factor from said bit amount/error amount control section;

said quantization section for quantizing and dequantizing said MDCT frequency spectrum normalized by said normalization processing section;

said Huffman encoding section for performing Huffman encoding of said quantized MDCT frequency spectrum to output a Huffman code book number and a Huffman code and to calculate an amount of used bits; and a multiplexer section for multiplexing the processing block type from said block type determination section, the scale factor from said bit amount/error amount control section, the Huffman code book number and the Huffman code from said Huffman encoding section.

16. The audio signal encoding apparatus according to claim 15, further comprising a switching section for switching between execution and stop of the calculation processing of said SMR operation section based on the result of sine wave discrimination in said sine wave discrimination section.

17. The audio signal encoding apparatus according to claim 16, wherein when the output value from said SMR operation section is not used, a preset SMR value is used in said switching section for switching between use and nonuse of an output value from said SMR operation section based on the result of sine wave discrimination in said sine wave discrimination section.

18. The audio signal encoding apparatus according to claim 15, wherein when the output value from said SMR operation section is not used, a preset SMR value is used in said switching section for switching between use and nonuse of an output value from said SMR operation section based on the result of sine wave discrimination in said sine wave discrimination section.

* * * * *